(12) United States Patent
Wieduwilt et al.

(10) Patent No.: US 11,138,107 B2
(45) Date of Patent: *Oct. 5, 2021

(54) MODIFYING SUBSETS OF MEMORY BANK OPERATING PARAMETERS

(71) Applicant: Micron Technology, Inc., Boise, ID (US)

(72) Inventors: Christopher G. Wieduwilt, Boise, ID (US); Alan J. Wilson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/796,860

(22) Filed: Feb. 20, 2020

(65) Prior Publication Data

US 2021/0263848 A1 Aug. 26, 2021

(51) Int. Cl.
| | |
|---|---|
| *G06F 12/06* | (2006.01) |
| *G11C 29/50* | (2006.01) |
| *G11C 11/56* | (2006.01) |
| *G11C 29/00* | (2006.01) |

(52) U.S. Cl.
CPC ...... *G06F 12/0692* (2013.01); *G11C 11/5628* (2013.01); *G11C 29/50* (2013.01); *G11C 29/789* (2013.01); *G06F 2212/1016* (2013.01)

(58) Field of Classification Search
CPC ......... G06F 12/0692; G06F 2212/1016; G11C 11/5628; G11C 29/50; G11C 29/789
See application file for complete search history.

(56) References Cited

U.S. PATENT DOCUMENTS

| | | | |
|---|---|---|---|
| 10,600,496 B1 * | 3/2020 | Wieduwilt | G11C 29/789 |
| 2005/0024948 A1 * | 2/2005 | Kanamitsu | G11C 11/5628 |
| | | | 365/189.05 |
| 2007/0263476 A1 * | 11/2007 | Bhushan | G11C 29/50 |
| | | | 365/233.5 |
| 2010/0199138 A1 * | 8/2010 | Rho | G06F 11/1048 |
| | | | 714/746 |
| 2018/0137913 A1 * | 5/2018 | Kim | G11C 13/004 |

* cited by examiner

*Primary Examiner* — Sultana Begum

(74) *Attorney, Agent, or Firm* — Holland & Hart LLP

(57) ABSTRACT

Methods, systems, and devices for modifying subsets of memory bank operating parameters are described. First global trimming information may be configured to adjust a first subset of operating parameters for a set of memory banks within a memory system. Second global trimming information may be configured to adjust a second subset of operating parameters for the set of memory banks. Local trimming information may be used to adjust one of the subsets of the operating parameters for a subset of the memory banks. To adjust one of the subsets of the operating parameters, the local trimming information may be combined with one of the first or second global trimming information to yield additional local trimming information that is used to adjust a corresponding subset of the operating parameters at the subset of the memory banks.

25 Claims, 7 Drawing Sheets

500

MODIFYING SUBSETS OF MEMORY BANK OPERATING PARAMETERS

BACKGROUND

The following relates generally to operating a memory system and more specifically to modifying subsets of memory bank operating parameters.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
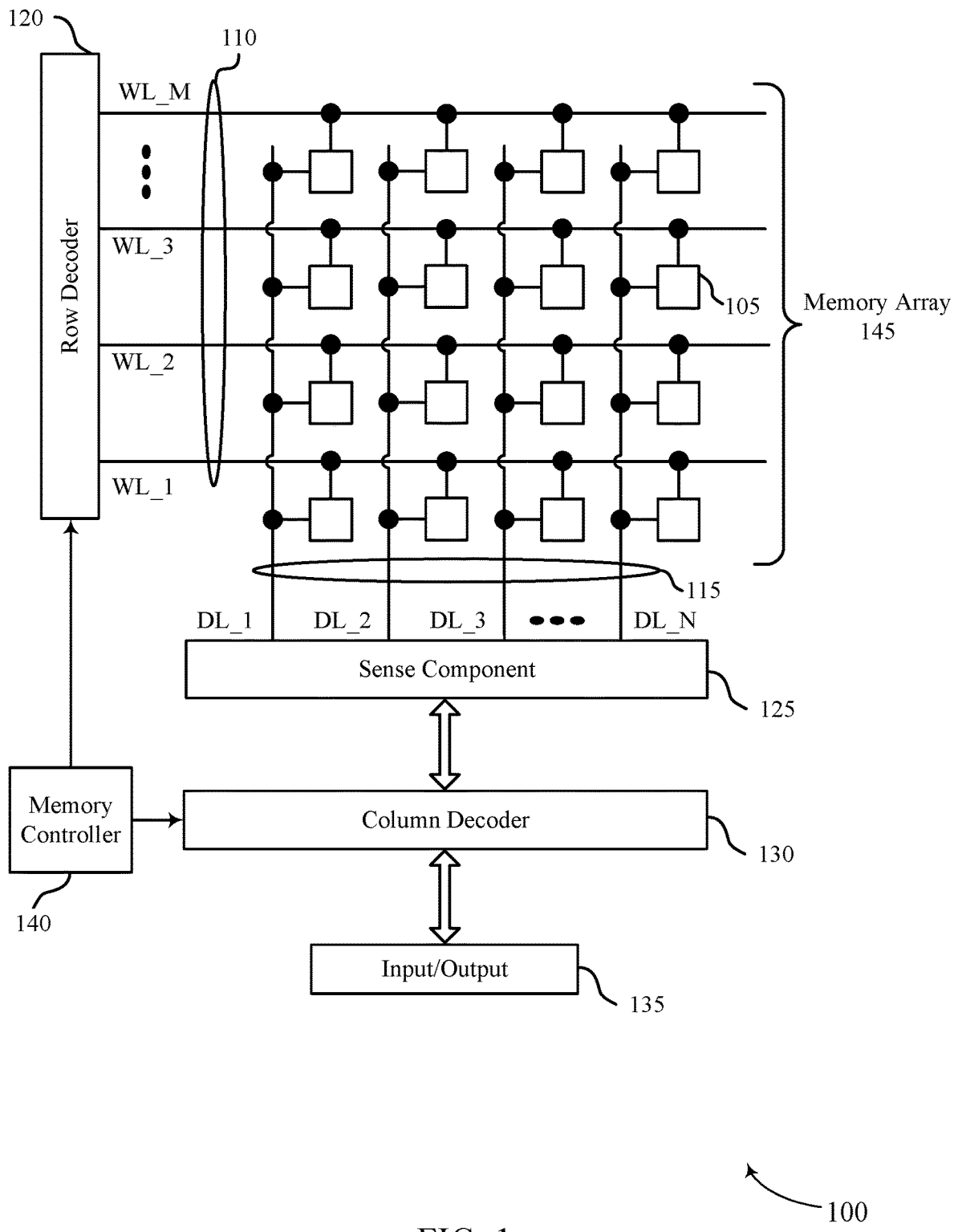
FIG. 1 illustrates aspects of an exemplary memory system that supports modifying subsets of memory bank operating parameters in accordance with examples as disclosed herein.

A memory system may be configured with multiple memory banks. A memory system may also be configured with circuitry that may be used to adjust operating parameters (e.g., timing, voltage, and/or current parameters) for the memory system. In some cases, the circuitry for adjusting the operating parameters may be referred to as "trimming circuitry." The trimming circuitry may adjust operating parameters for the memory system based on received information, which may be referred to as "trimming information." In some cases, one type of trimming information (which may be referred to as "global trimming information") may be used to adjust operating parameters for most or all of the memory banks within the memory system. In some examples, a single set of global trimming information may be used to adjust a single set of operating parameters in the memory system. In some cases, another type of trimming information (which may be referred to as "local trimming information") may be used to adjust operating parameters for a subset of the memory banks within the memory system. In some examples, a single set of local trimming information may be used to adjust the single set of operating parameters for the subset of memory banks.

By using global and local trimming information to adjust the operating parameters, a performance of the memory system may be improved. That is, using the global trimming information to adjust one or more operating parameters for the memory system may increase a performance of the memory system. And after global trimming information is used to adjust the one or more operating parameters for most or all of the memory banks in the memory system, local trimming information (or a combination of the global and local trimming information) may be used to adjust the one or more operating parameters for a subset of the memory banks in the memory system, further improving a performance of the memory system.

Using a first set of global trimming information to adjust a first subset of operating parameters and a second set of global trimming information to separately adjust a second subset of operating parameters may result in increased performance enhancements for the memory system. Thus, to increase a performance of a memory system, multiple sets of global trimming information may be generated to separately adjust multiple sets of operating parameters for the memory system. Similarly, after the multiple sets of global trimming information are used to adjust the operating parameters for the memory banks in the memory system, multiple sets of local trimming information (or a combination of the multiple sets of global and local trimming information) may be used to further adjust one or more sets of operating parameters for a subset of the memory banks in the memory system, further improving a performance of the memory system. In some examples, additional circuitry may be included in memory system to support the combination of the multiple sets of local and global trimming information.

In some cases, to decrease a complexity of a memory system when multiple sets of global trimming information are used, a single set of local trimming information may be generated and used to adjust one of multiple sets of operating parameters for a subset of the memory banks. The single set of local trimming information may be generated to adjust a particular set of operating parameters (e.g., a voltage parameter) based on a determination that an adjustment to the particular set of operating parameters may yield a larger performance increase for the subset of memory banks relative to an adjustment to the other sets of operating parameters (e.g., a timing parameter and/or a current parameter). In some examples, additional circuitry may be included in the memory system to support the combination of a single set of local trimming information with a corresponding set of global trimming information that is used for adjusting a same set of operating parameters as the local trimming information. In some examples, the additional circuitry includes routing logic (e.g., a demultiplexer) that determines which set of global trimming information is to be combined with the set of local trimming information. The routing logic may provide the local trimming information to circuitry that combines the set of global trimming information with the set of local trimming information.

Aspects of the disclosure introduced above are further described below in the context of a memory system. Specific examples are described of circuitry for and exemplary operation of a memory array that includes multiple memory banks and supports modifying subsets of memory bank operating parameters. Aspects of the disclosure are further illustrated by and described with reference to an apparatus diagram and flowcharts that relate to modifying subsets of memory bank operating parameters.

FIG. 1 illustrates aspects of an exemplary memory system that supports modifying subsets of memory bank operating parameters in accordance with examples as disclosed herein e. Memory system 100 may be used to store digital information (e.g., binary information) and may also be referred to as an electronic memory apparatus. Memory system 100 includes row decoder 120, sense component 125, column decoder 130, input/output 135, memory controller 140, and memory array 145.

Memory array 145 may include memory cells, such as memory cell 105, access lines 110, and digit lines 115. Memory cells may be programmable to store different states. For instance, memory cell 105 may be programmable to store two states, denoted as a logic 0 and a logic 1. In some cases, memory cell 105 is configured to store more than two logic states.

A memory cell 105 may include a memory element having programmable states. A memory cell 105 in a DRAM or FeRAM architecture may store a charge representative of the programmable states in a capacitor; for example, a charged and uncharged capacitor may represent two logic states, respectively. DRAM architectures may commonly use such a design and may use a capacitor including a dielectric material and having linear electric polarization properties as a memory element. FeRAM architectures may also use such a design, but the capacitor used as the memory element may include a ferroelectric material with non-linear polarization properties. A memory cell 105 in a PCM or segregation based memory (SBM) architecture may change a resistivity (e.g., resistance or threshold voltage) of a material where different resistivity may represent different logic states. PCM and/or SBM architectures may use chalcogenide materials having electronically programmable resistances as memory elements. In some cases, a memory cell 105 in a PCM architecture is programmed by changing a phase of a memory material. In some cases, a memory cell 105 in an SBM architecture is programmed by causing ion movement within a memory material.

Operations such as reading and writing may be performed on memory cells 105 by activating or selecting the appropriate access line 110 and digit line 115. Access lines 110 may also be referred to as word lines 110 or row lines 110 and digit lines 115 may also be referred to as bit lines 115 or column lines 115. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell (e.g., a capacitor) may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory system 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_3 and DL_N, the memory cell 105 at their intersection may be accessed.

Upon accessing, a memory cell 105 may be read, or sensed, by sense component 125 to determine the stored state of the memory cell 105. For example, after accessing the memory cell 105, the capacitor of memory cell 105 may discharge onto its corresponding digit line 115. Discharging the capacitor may be based on biasing, or applying a voltage, to the capacitor. The discharging may induce a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. With respect to a memory cell 105 that includes a ferroelectric capacitor, reading the memory cell may include biasing—e.g., applying a voltage to—a plate of the ferroelectric capacitor.

The reliability of a sensing operation may be dependent on a sensing window that results from reading the memory cell 105. For instance, a larger sensing window may be associated with fewer bit errors than a smaller sensing window. The sensing window may be determined as the difference between a voltage of a digit line 115 resulting from reading a memory cell 105 when storing a logic 1 and a voltage of the digit line 115 resulting from reading the memory cell when storing a logic 0. Sense component 125 may include various transistors or amplifiers in order to detect and amplify a difference in the signals, which may be referred to as latching. The detected logic state of memory cell 105 may then be output through column decoder 130 as output 135.

A memory cell 105 may be set, or written, by activating the relevant word line 110 and digit line 115. As discussed herein, activating a word line 110 electrically connects the corresponding row of memory cells 105 to their respective digit lines 115. By controlling the relevant digit line 115 while the word line 110 is activated, a memory cell 105 may be written—e.g., a logic value may be stored in the memory cell 105. Column decoder 130 may accept data, for example input 135, to be written to the memory cells 105.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory system 100. In general, the amplitude, shape, or duration of an applied voltage discussed herein may be adjusted or varied and may be different for the various operations for operating memory system 100. Furthermore, one, multiple, or all memory cells 105 within memory system 100 may be accessed simultaneously; for example, multiple or all cells of memory system 100 may be accessed simultaneously during a reset operation in which all memory cells 105, or a group of memory cells 105, are set to a single logic state.

In some examples, memory system 100 may be formed on an integrated circuit. An integrated circuit may include multiple copies of an electronic circuit on a single semiconductor material. For example, an integrated circuit may include multiple physical copies of memory system 100.

An integrated circuit including multiple physical copies of an electronic circuit, such as memory system 100, may be partitioned into individual integrated circuit dies (or "dies"), where each die may include a single copy of the electronic circuit. In some examples, at least some components (e.g., conductive traces, capacitive elements, resistive elements, transistors, drivers, and circuit logic, etc.) of a particular die of the integrated circuit may be represented by the components of memory system 100.

In some cases, characteristics of an electronic circuit on one die of an integrated circuit may vary from characteristics of an electronic circuit on another die of the integrated circuit—e.g., due to process variations and/or manufacturing defects. For example, a physical implementation of memory system 100 on one die may have different propagation delays, slew rates, and/or desired operating voltages than on another die. In some cases, operating parameters (e.g., timing, voltage levels, and/or current levels) used to operate the components of an electronic circuit on one die may be less effective or inadequate for the components of the electronic circuit on another die.

In some cases, characteristics within the dies of an integrated circuit may be adjusted (or "trimmed") for a particular die so that operating parameters can be used to operate the components on the particular die. For example, a voltage used to access memory cells on a particular die may be modified (e.g., increased or decreased) relative to a default voltage used to access memory cells on other dies of a same integrated circuit. In another example, a timing of applied voltages or currents for accessing memory cells on the particular die may be modified relative to a default timing for applying voltages or currents to access memory cells on dies of a same or different integrated circuit—e.g., a duration between applying a first voltage and a second voltage may be increased or decreased.

To adjust the operating parameters used to operate components of a particular die, information for adjusting the operating parameters (or "trimming information" or "trim parameters") may be stored in the die and broadcast to relevant device(s) of the electronic circuit (e.g., on power-up). The relevant device(s) receiving the information may alter a magnitude or timing of signals applied to components (e.g., memory cells) in the die based on the received information—e.g., by activating delay components or modifying an output voltage of a driver. In some cases, the trimming information may apply throughout the die and may be referred to as "global trimming information" or "global trim parameters."

In some cases, a particular die may be tested before operating parameters adjustments are determined for a particular die. During testing, characteristics of the particular die may be determined and potential adjustments to operating parameters for the die may be identified accordingly. For example, the magnitude of voltages applied to certain memory cells, propagation delays, and read/write errors in memory system 100 may be observed during the testing phase and adjustments to the voltages and delays that would yield less read/write errors for memory system 100 may be determined. In some cases, the timing parameters and voltage parameters may be selected so that memory cells, such as memory cell 105, are accessible within a desired timing constraint or within a desired error rate. In some cases, information corresponding to operating parameter adjustments (e.g., trimming information or trim parameters) determined for a particular die may be stored in components of the electronic circuit/die, as discussed above and herein.

In some examples, during the testing phase, row lines 110, column lines 115, and/or plate lines that are defective or coupled with defective memory cells may be identified along with corresponding row, column, or plate addresses. In some cases, memory addresses corresponding to the defective access lines or memory cells (or "repair information") may be stored in components of the electronic circuit/die, as discussed above and herein. In some cases, such testing is continued throughout the life of a particular die and operating parameters may also be changed throughout the life of the die based on the results of the continued testing. In other cases, the trimming information and repair information may be determined without performing a prior testing operation—e.g., to correct known or predicted issues.

In some cases, trimming or repair information for a die may be stored in non-volatile storage elements (or "fuses"). A fuse may be or include a device that may be set to a high or low resistive state (either semi-permanently or permanently). For example, a fuse may be an analog fuse that permanently stores a high resistance state after a filament in the fuse is melted or an electronic fuse with a variable resistance that is programmable to have either a high or low resistance. In some examples, the fuse may be an example of an anti-fuse that permanently stores a low resistance state after a voltage above a threshold is applied.

An electronic circuit including multiple fuses may designate certain fuses to certain types of information. For example, for an electronic circuit including components of memory system 100 and fuses, some of the fuses (or "option fuses") may be used to store trimming information that causes memory cells 105 in memory system 100 to be accessed according to particular timing and/or biasing parameters determined for the particular die. While other of the fuses (or "repair fuses") may be used to store repair information—e.g., row, column, and/or plate addresses corresponding to row lines 110, column lines 115, and/or plate lines in memory system 100 that are identified as defective or coupled with memory cells 105 in memory system 100 that are identified as defective.

In some examples, storing trimming information may include identifying (e.g., during testing) timing parameters or voltage parameters or both for accessing memory cells in memory system 100 and determining a corresponding trim parameter (e.g., "01") to store in the option fuses. In some cases, a trim parameter may also be referred to as a "trim code." In some cases, the trim parameter may be selected to ensure that memory cells are accessible within desired timing constraints and with a desired error rate—e.g., by using particular timing and voltage values for accessing the memory cells. Similarly, row lines 110, column lines 115, and/or plate lines that are defective or coupled with defective memory cells may be identified and corresponding row, column, or plate addresses may be stored in repair fuses.

In some cases, a die is configured so that most or all of the fuses in the die are positioned in a fuse array—e.g., to simplify the manufacturing process. The fuse array may include one or more fuse sets, each fuse set including multiple fuses. In some cases, the number of fuses in a fuse set is determined based on a number of bits used to convey information that is to be stored in a fuse set. For example, the number of fuses included in the one or more fuse sets may be greater than or equal to the largest number of bits used to convey a certain type of information to be stored in a fuse set—e.g., if 16 bits are used to convey a first type of information (such as a row address), then each fuse set may include 16 fuses. Similarly, a size of an electronic communications bus may be determined based on the number of fuses and/or the largest number of bits used to convey information stored in a fuse set—e.g., if 16 bits are used to convey a first type of information (such as a row address), then the bus may be capable of conveying 16 bits of information in parallel.

In some cases, a die may also include a fuse logic component that implements a mapping between the information stored in the fuses and particular components of the die. For example, the fuse logic component may map trimming information stored in option fuses to corresponding option latches and repair information to corresponding repair latches.

Operating information stored in fuse sets may be broadcast (e.g., serially) throughout the die (e.g., on power-up) and aspects of the die may be operated according to the operating information. Broadcasting fuse data in memory system 100 may include passing a fuse token from one memory section to another and writing relevant information to latches in a memory section where the fuse token is active. For example, for a die including components of memory system 100 and a set of fuses, a trim parameter stored in option fuses may be broadcast to option latches throughout the die and memory cells 105 may be accessed using timing, voltages, and or currents corresponding to the trim parameter. In another example, defective memory addresses may be broadcast to repair latches throughout the die. Later, memory system 100 may receive a memory address in a request to access memory cells 105. The memory address may be compared with the latched defective memory addresses and a different, redundant set of memory cells 105 may be accessed when the memory address matches a defective memory address.

The die may also include multiple memory banks, each memory bank including a portion of the memory cells that are dispersed across the die. In some examples, when a memory system includes multiple memory banks, most or all of the fuses on the die may be located in a fuse array that is centrally-located relative to the memory banks—e.g., to simplify the manufacturing process, to increase density of the memory system, or the like. In some cases, particular fuses (e.g., option fuses) may store information (e.g., global trimming information) for most or all of the memory banks in a memory array. In some cases, particular fuses (e.g., both option and repair fuses) and/or fuse sets in a fuse array may be mapped to and store information (e.g., repair information) for particular memory banks. In some examples, information stored in a fuse set associated with a particular memory bank may be delivered and stored at a latch that is local to the particular memory bank. In some cases—e.g., at power up—the information stored in the fuses may be broadcast to local latches throughout the memory system.

In some examples, memory system 100 includes a fuse array and multiple memory banks. As discussed herein, process variations across an integrated circuit may result in variations across different dies of the integrated circuit. Similarly, process variations may result in variations across different memory banks. In some cases, certain memory banks may meet timing, voltage, and/or reliability standards when operated using particular operating parameters, while other memory banks may not. In some examples, global trimming information used to adjust the operating parameters of most or all of the memory banks in a memory system may enhance the operation of some memory banks in memory system 100, while hindering or having little effect on other memory banks in memory system 100. For example, applying a global trim parameter of "10" to most or all of the memory banks may cause all but two of the memory banks to perform within specification.

Accordingly, information for adjusting operating parameters of particular memory banks or memory bank groups (or "local trimming information") may be determined and stored, in addition to, or instead of, information for adjusting operating parameters for the full memory system—that is, in addition to global trimming information. Local trimming information may be determined based on testing, or predicted behavior, of the memory banks. For example, applying a local trim parameter of "01" to the two memory banks that failed to meet specification after the application of the global trim parameter may bring the two memory banks within specification. Thus, in such an example, all of the memory banks may operate within specification if a global trim parameter of "10" is applied to most of the memory banks in the memory system and a local trim parameter of "01" is applied to the other two memory banks.

In some cases, the local trimming information may be stored in additional fuse sets. For example, first local trimming information for a first memory bank or memory bank group may be stored in a first fuse set, second local trimming information for a second memory bank or memory bank group may be stored in a second fuse set, and so on. The local trimming information may be broadcast to latches throughout memory system 100. For example, local trimming information for a first memory bank and stored in a first fuse set may be transmitted to a local trimming latch located within or proximate to the first memory bank. In some cases, broadcasting information from additional fuse sets may increase a fuse broadcasting period as each additional fuse set may be individually latched.

In some cases, globally adjusting a single set of operating parameters of a set of memory banks and locally adjusting the single set of operating parameters of a subset of the memory banks may result in all of the memory banks in a memory array being brought within operating specifications. However, in some cases, globally and locally adjusting the single set of operating parameters may not bring all of the memory banks within operating specifications. And even when all of the memory banks are brought within operating specification, in some cases, a performance of certain memory banks may be further improved if a subset of the operating parameters are modified for the certain memory banks. That is, for certain memory banks, locally adjusting a subset of the single set of operating parameters instead of adjusting the single set of operating parameters may further improve a performance of the certain memory banks and may improve the overall performance of the memory device.

To enable the local adjustment of a subset of operating parameters for one or more memory banks, a memory array may be configured to utilize multiple global trim parameters. In some cases, each global trim parameter may be configured to modify different operating parameters for a set of memory banks in a memory array. In some examples, a first global trim parameter may be configured to adjust a first operating parameter (e.g., a timing parameter) for the set of memory banks, and a second global trim parameter may be configured to adjust a second operating parameter (e.g., a voltage parameter) for the set of memory banks. In some examples, a first global trim parameter may be configured to adjust a set of operating parameters (e.g., voltage, timing, and current) for a signal originating from a first oscillator, and a second global trim parameter may be configured to adjust the same set of operating parameters for a signal originating from a second oscillator. By applying different global adjustments to different sets of operating parameters, instead of a single global adjustment to adjust a single set of operating parameters, a performance of a memory array may be increased.

In some cases, local trimming techniques may be used in combination with global trimming techniques to enable the adjustment of particular operating parameters at particular memory banks. For example, after multiple global trim parameters are determined, memory system 100 may uniformly apply the multiple global trim parameters to adjust the corresponding sets of operating parameters for each memory bank in memory system 100. In some cases, each global trim parameter may be used to modify a respective operating parameter (or set of operating parameters) for the memory bank in memory system 100. After adjusting the operating parameters using the global trim parameters, a performance of one or more memory banks may be identified as being below a threshold, and local trimming information to bring the one or more memory banks within operating specifications may be determined. In some examples, adjusting a subset of the operating parameters at the one or more memory banks may be determined to increase a performance of the one or more memory banks relative to adjusting a single set (e.g., most or all) of the operating parameters at the one or more memory banks. Thus, local trimming information that results in the generation of a local trim parameter may be determined, where memory system 100 may use the local trimming information to modify a subset of the operating parameters, rather than the single set of the operating parameters, at the memory bank. In some cases, the memory system 100 may store the local trimming information in one or more fuse sets—e.g., in fuse sets storing repair information for the one or more memory banks.

After storing the local trimming information, memory system 100 may provide the local trimming information to the respective memory banks (e.g., during a broadcast operation), and the memory bank may store and use the respective local trimming information to adjust operating parameters. In some cases, the local trimming information is provided to circuitry that is used to combine the local trimming information with a corresponding set of global trimming information—e.g., global trimming information that is used to adapt common operating parameter(s).

A memory bank may use the local trimming information to override a selected global trim parameter. For example, the memory bank may adjust a first operating parameter based on a received first global trim parameter (e.g., "10") and a second operating parameter based on a received second global trim parameter (e.g., "11"). After adjusting the first and second operating parameters, the memory bank may receive local trimming information for the first operating parameter in the form of a local trim parameter and may adjust the first operating parameter based on the local trim parameter (e.g., "01") instead of the first global trim parameter. In such cases, the local trimming information may be equivalent to the local trim parameter.

The memory bank may generate a local trim parameter for a subset of operating parameters based on XOR'ing local trimming information with a global trimming parameter used for the operating parameter, and the generated local trim parameter may override the global trim parameter. For example, a first global trimming parameter having a value "10" may be XOR'ed with local trimming information having a value "11" to generate a local trim parameter having a value "01." And the generated local trim parameter may be used to adjust the subset of operating parameters at the memory bank. In some examples, if a value of the local trimming information is "00" no changes to the global trim parameter will occur.

A memory bank may use the local trimming information to add resolution to a selected global trim parameter. For example, the memory bank may adjust a first operating parameter based on a received first global trim parameter (e.g., "10") and a second operating parameter based on a received second global trim parameter (e.g., "11"). After adjusting the operating parameters using the first and second global trim parameters, memory system 100 may test the memory banks and determine that the performance of the memory bank is below a threshold and that additional trimming would be beneficial. The memory bank may then receive local trimming information (e.g., "11") and generate a local trim parameter (e.g., "1011") based on combining the local trimming information with the first global trim parameter. In this way, the first operating parameter of the memory bank may be adjusted relative to a global adjustment that is applied to each memory bank in memory system 100.

A demultiplexer may be used to route local trimming information for a first subset of operating parameters to circuitry that receives global trimming information for the first subset of operating parameters and away from circuitry that receives global trimming information for a different subset of operating parameters. In some examples, the demultiplexer sends a null signal (or refrains from signaling) to the circuitry that receives the global trimming information for the different subset of operating parameters.

Figure 2:
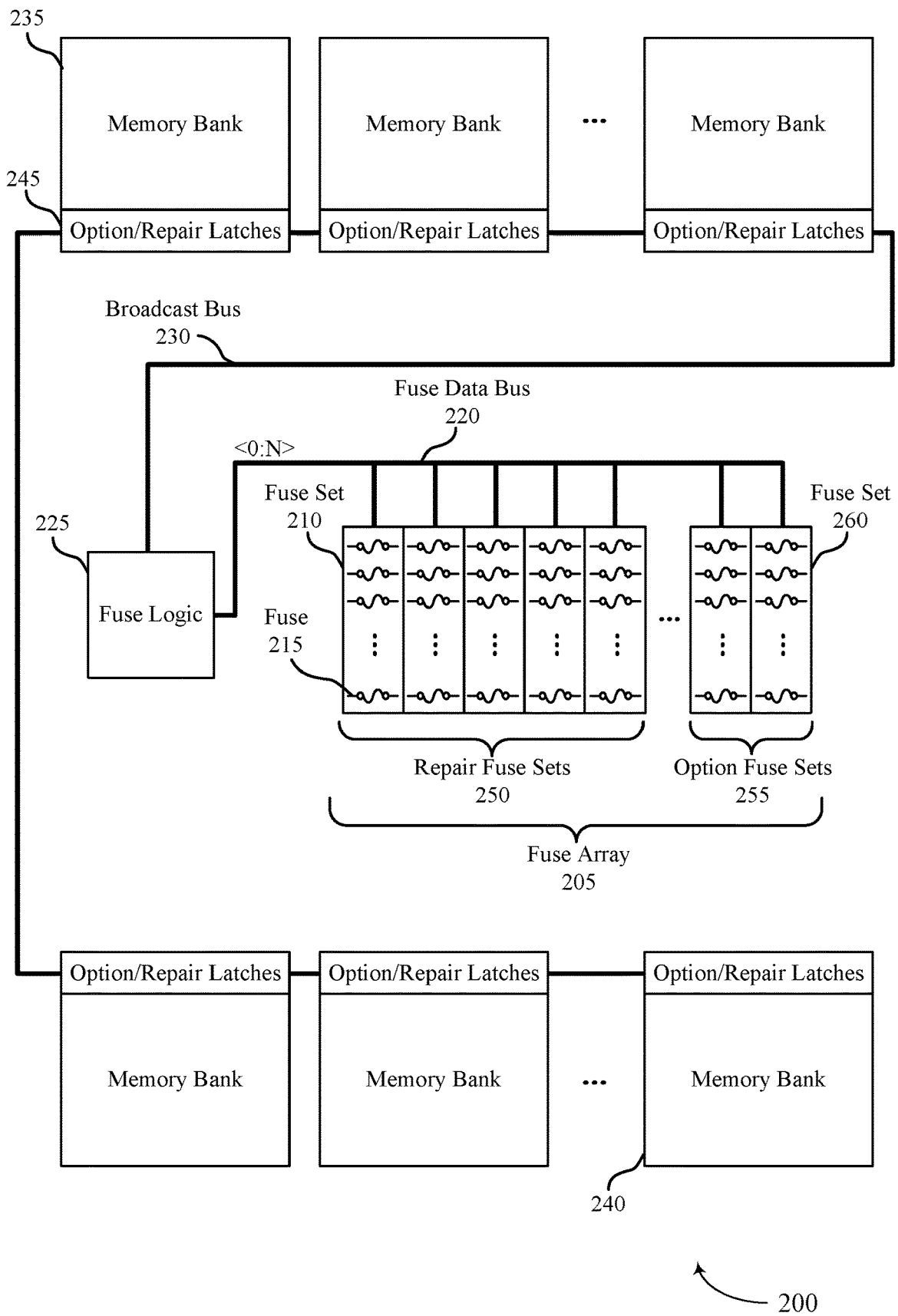
FIG. 2 illustrates aspects of an exemplary memory system that supports modifying subsets of memory bank operating parameters in accordance with examples as disclosed herein.

FIG. 2 illustrates aspects of an exemplary memory system that supports modifying subsets of memory bank operating parameters in accordance with examples as disclosed herein. Memory system 200 may be configured to store logic values and may include aspects of memory system 100 discussed in FIG. 1. Memory system 200 may include fuse array 205, fuse data bus 220, fuse logic component 225, broadcast bus 230, first memory bank 235, second memory bank 240, and latches 245.

Fuse array 205 may be configured to store operating information for memory system 200. In some cases, the operating information may include information for adjusting operating parameters of memory system 200. For example, fuse array 205 may include trimming information which may be used to adjust a timing and level of voltages or currents that are applied throughout memory system 200. Fuse array 205 may also include repair information which may be used to indicate that particular rows, columns, or plate lines are defective or associated with defective memory cells. In some cases, fuse array 205 is centrally located relative to memory banks in memory system 200.

In some cases, fuse array 205 may be partitioned into multiple fuse sets, including fuse set 210. In some cases, fuse sets may be configured to store different types of information. For instance, the fuse sets of fuse array 205 may be configured to be repair fuse sets 250 or option fuse sets 255. Repair fuse sets 250 may store memory addresses identifying defective memory elements (e.g., column, rows, plates, and/or memory cells) in particular memory banks. Option fuse sets 255 may store trimming information. In some cases, multiple option fuse sets 255 may be used to store multiple sets of global trimming information that is common to most or all of the memory banks. For example, a first option fuse set may store global trimming information for a first operating parameter and a second option fuse set may store global trimming information for a second operating parameter. In some cases, option fuse sets 255 may also be used to store local trimming information that is unique to a subset (e.g., one) of the memory banks.

In some examples, each fuse set may include the same number of fuses, which may be represented by N. For instance, each fuse set may include a sufficient number of fuses to support the largest type of data—e.g., if a row address is 15 bits, a column address is 6 bits, and a plate address is 13 bits, then each fuse set in fuse array 205 may include at least 15 fuses. Since the fuse sets may be configured to support the largest type of data, at times, a fuse set may have more fuses than there are data bits to be stored in the fuse set—e.g., a 14-bit column address may be stored in a fuse set containing 16 fuses. In such cases, certain fuses in a fuse set may go unused. To fully utilize all of the fuses in a fuse set, fuse sets may be configured to store repair and/or trimming information for a particular memory bank or memory bank group—e.g., fuse set 210 may store a defective row, column, or plate address for first memory bank 235 and/or fuse set 210 may store a trim parameter for first memory bank 235 or for a group of memory banks including first memory bank 235. In some cases, fuse sets that store a smaller data type may be configured to also store trimming information (e.g., local trimming information).

Fuse set 210 may include multiple fuses, including fuse 215. As suggested herein, the number of fuses included in fuse set 210 may be based on the largest data type to be stored in fuse array 205. Fuse 215 may be configured to store one bit of data—e.g., fuse 215 may store one bit of a 15-bit column address. In some cases, fuse 215 may be temporarily or permanently programmed to have a high resistance or low resistance, which may correspond to a logic 0 and a logic 1, respectively or vice versa. In some cases, fuse 215 is permanently programmed to have a high resistance by melting a conductive material in fuse 215 until current can no longer flow through fuse 215.

Fuse data bus 220 may be configured to uni-directionally or bi-directionally communicate the operating information to and from fuse array 205. In some cases, fuse data bus 220 is configured to support parallel signaling of the information bits stored in all of the fuses of a single fuse set and serial signaling of the data stored in each fuse set—e.g., fuse data bus 220 may concurrently signal 16 bits of information from one fuse set, concurrently signal 16 bits of information from another fuse set, and so on. To support parallel signaling of all of the information bits stored in a fuse set, a size of fuse data bus 220 may be configured to be large enough to support the largest type of data to be stored in fuse array 205. Additionally, or alternatively, a size of fuse data bus 220 may be configured to be at least as large as the fuse sets in fuse array 205. In some cases, fuse data bus 220 includes multiple conductive traces, which may be represented by the number N—e.g., if fuse set 210 includes 16 fuses, then fuse data bus 220 may include 16 conductive traces. Fuse data bus 220 may communicate the information stored in fuse array 205 to fuse logic component 225.

Fuse logic component 225 may be configured to process and distribute the information stored in fuse array 205 to the appropriate locations throughout memory system 200. For example, fuse logic component 225 may access and transmit data stored in particular fuse sets to particular latches throughout memory system 200. Fuse logic component 225 may ensure that the proper information is sent to the proper latches and/or memory bank by transmitting an activation signal (or "token") that is passed throughout memory system 200 and a series of pulses that indicate when to latch data, as discussed in more detail herein and with reference to FIGS. 3A and 3B. For instance, when fuse set 210 stores repair information for first memory bank 235, fuse logic component 225 may ensure that the repair information is delivered to repair latches included in latches 245. Fuse logic component 225 may transmit the activation signal and pulses over broadcast bus 230. Similarly, when fuse set 260 stores global trimming information, fuse logic component 225 may ensure that the global trimming information is provided to each option latch in memory system 200. In some cases, the process of distributing the data stored in the fuse sets of fuse array 205 throughout memory system 200 may be referred to as broadcasting.

Broadcast bus 230 may be configured to deliver fuse data to particular latches located throughout memory system 200, along with signaling (e.g., an activation signal and clock signal) to ensure that the proper fuse data is stored in the proper latch locations.

Memory system 200 includes multiple memory banks, such as first memory bank 235 and second memory bank 240. In some cases, the memory banks in memory system 200 are grouped into memory bank groups—e.g., first memory bank 235 may be associated with a first memory bank group and second memory bank 240 may be associated with a second memory bank group. Each memory bank group may include a subset of the memory banks included in memory system 200.

First memory bank 235 may be configured to store electronic data (e.g., user data). First memory bank 235 may include multiple memory cells which may be arranged in rows and columns. The memory cells in first memory bank 235 may also be coupled with and accessible via row lines, column lines, and/or plate lines. In some cases, certain memory cells, row lines, column lines, and/or plate lines may be identified as being corrupted or defective—e.g., due to manufacturing failures, overheating, and the like. Second memory bank 240 may be similarly constructed as first memory bank 235.

Latches 245 may be configured to store information for operating first memory bank 235. In some cases, latches 245 may include repair latches and/or option latches. In some example, repair latches in latches 245 may store memory addresses corresponding to defective memory elements identified in first memory bank 235—e.g., defective row, column, plates or memory cells. Additionally, or alternatively, option latches in latches 245 may store trim parameters for adjusting a timing or magnitude of voltage or currents applied to components of first memory bank 235. In some cases, a first option latch is configured to store a first global trim parameter and a second option latch is configured to store a second global trim parameter.

To increase a performance of a memory system, a global trim parameter may be used to adjust the operating parameters of the memory system. However, in some cases, the application of the global trim parameter may increase a performance of a majority of memory banks while marginally increasing (or hindering) a performance of other memory banks. For example, after a global trim parameter is applied, the adjusted operating parameters (e.g., adjusted voltage levels and timing) may be used to successfully operate second memory bank 240 but may fail to successfully operate first memory bank 235. In some cases, a memory bank may be successfully operated when a desired read/write error rate is achieved for the memory bank.

In some cases, all of the memory banks in a memory system may be brought within operating specifications if multiple global trim parameters are applied relative to if a single global trim parameter is applied. In some examples, a first global trim parameter may be used to adjust a first subset of operating parameters while a second global trim parameter may be used to independently adjust a second subset of operating parameters for a memory system. In some cases, applying independent adjustments to different sets of operating parameters may result (on average) in an increased performance across all of the memory banks in a memory system relative to a blanket adjustment of a single set (e.g., most or all) of the operating parameters.

In some cases, after multiple global trim parameters are applied, one or more memory banks in a memory system may continue to fail. Thus, local trimming information may be used to independently adjust one or more subsets of operating parameters for the failed memory banks, which may improve a performance of the failed memory banks and bring the failed memory banks within operating specifications. In some examples, adjusting a particular subset of the operating parameters or a memory bank may result in an increased performance enhancement relative to adjusting a single set (e.g., most or all) of the operating parameters or adjusting a different subset of the operating parameters. Thus, local trimming information that is used to adjust a desired subset of operating parameters may be determined. In some cases, determining local trimming information for a single subset of operating parameters may reduce an amount of trimming data to be stored by a memory system and/or reduce a complexity of a memory system.

In some examples, local trimming information for a subset of memory banks and a subset of operating parameters may be stored in repair fuse sets 250 associated with the single memory bank or single memory bank group. For instance, fuse set 210 may store repair information for first memory bank 235 and local trimming information for first memory bank 235. In another instance, fuse set 210 may store repair information for first memory bank 235 and local trimming information for a subset of memory bank group including first memory bank 235 and a subset of operating parameters. By storing local trimming information for a particular memory bank or memory bank group in a fuse set configured to store repair information for the memory bank or a memory bank in the memory bank group, a memory system may refrain from adding additional fuse sets to fuse array 205. Also, by storing local trimming information in this way, a memory system may facilitate delivery of the local trimming information to local latches of the particular memory bank or memory bank group.

When adjusting a subset of operating parameters at a subset of memory banks, fuse logic component 225 may be used to broadcast the operating information (e.g., the global trimming, repair, and local trimming information) to the appropriate option and repair latches throughout memory system 200. Broadcasting operating information to, and storing the operating information in, latches is discussed with more detail herein and with reference to FIGS. 3A and 3B.

After the operating information has been stored in the appropriate latches, the operating information may be used to adjust operating parameters of the memory banks in memory system 200 and/or identify defective memory elements in particular memory banks. For example, a trim parameter may be sent to circuitry that introduces a delay or modifies a magnitude of voltages applied within a memory bank. In another example, a memory bank may signal if a memory address received from another device matches any memory addresses that have been identified as defective in a memory bank. Adjusting operating parameters and identifying requests to access defective memory address is described in more detail herein.

Figure 3A:
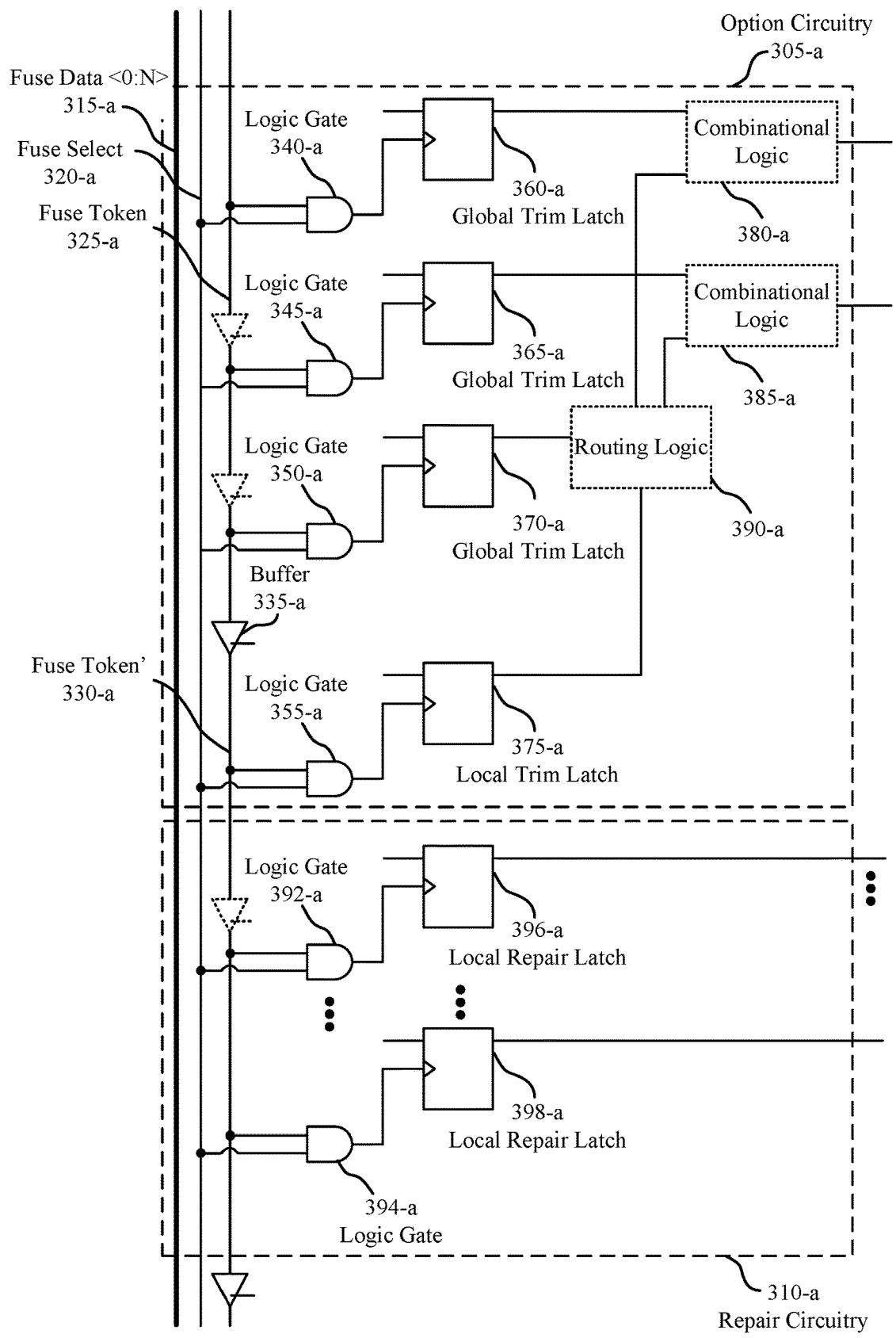
FIG. 3A illustrates aspects of an exemplary memory bank for modifying subsets of memory bank operating parameters in accordance with examples as disclosed herein.

FIG. 3A illustrates aspects of an exemplary memory bank that supports modifying subsets of memory bank operating parameters in accordance with examples as disclosed herein. An exemplary configuration of option and repair circuitry included in a memory bank is depicted in FIG. 3A.

Memory bank 300-a may be configured to store electronic data and may be an example of first memory bank 235 or second memory bank 240 discussed in FIG. 2. Memory bank 300-a may be one of multiple memory banks included in a memory system and may be coupled with a fuse array. In some cases, memory bank 300-a may be coupled with one or more fuse sets (e.g., fuse set 210 of FIG. 2) configured to convey first information (e.g., global trimming information) for adjusting an access parameter of multiple or all memory banks included in a memory system. Memory bank 300-a may also be coupled with one or more second fuse sets (e.g., fuse set 260 of FIG. 2) configured to convey second information (e.g., local trimming information) for adjusting the access parameter of memory bank 300-a or of a group of memory banks including memory bank 300-a.

Memory bank 300-a may include option circuitry 305-a, repair circuitry 310-a, fuse data bus 315-a, fuse select line 320-a, first fuse token line 325-a, and second fuse token line 330-a.

Option circuitry 305-a may be configured to process and store trimming information received from a fuse array. Option circuitry 305-a may include first logic gate 340-a, second logic gate 345-a, third logic gate 350-a, fourth logic gate 355-a, first global trimming latch 360-a, second global trimming latch 365-a, third global trimming latch 370-a, local trimming latch 375-a, buffer 335-a, first combinational logic 380-a, second combinational logic 385-a, and routing logic 390-a. In some cases, option circuitry 305-a includes multiple global trimming latches and multiple local trimming latches to support larger trim parameters (e.g., 14-bit trim parameters). In some cases, a trim parameter may be stored across multiple fuse sets and serially stored in a set of trimming latches.

First logic gate 340-a may be used to apply a clocking signal to first global trimming latch 360-a. In some cases, first logic gate 340-a is an AND gate. First logic gate 340-a may output a high voltage when first fuse token line 325-a and fuse select line 320-a are high. Second logic gate 345-a may be similarly configured as first logic gate 340-a and may be used to apply a clocking signal to second global trimming latch 365-a. Third logic gate 350-a may be similarly configured as first logic gate 340-a and second logic gate 345-*a* and may be used to apply a clocking signal to third global trimming latch 370-*a*. Fourth logic gate 355-*a* may be used to apply a clocking signal to local trimming latch 375-*a*. Fourth logic gate 355-*a* may output a high voltage when second fuse token line 330-*a* and fuse select line 320-*a* are high.

Buffer 335-*a* may be used to pass a fuse token from one section of memory bank 300-*a* to another. Buffer 335-*a* may be a tri-state buffer or latch. In some cases, buffer 335-*a* outputs a high voltage when first fuse token line 325-*a* is high after an activation signal is received. Buffer 335-*a* may continue to hold the high voltage even after the first fuse token line 325-*a* is low.

First global trimming latch 360-*a* may be configured to store a bit of first global trimming information that is used to adjust a first set of operating parameters at memory bank 300-*a*. In some examples, first global trimming latch 360-*a* may store a bit of a first global trim parameter. In some cases, first global trimming latch 360-*a* is a D flip flop. In some examples, a bit of data (e.g., a bit of a first global trim parameter) may be applied to the input of first global trimming latch 360-*a*, and a voltage corresponding to the bit of data may be output by first global trimming latch 360-*a* after receiving a clocking signal from first logic gate 340-*a*. In some cases, first global trimming latch 360-*a* is coupled with and receives first global trimming information from a first fuse set. In some cases, option circuitry 305-*a* includes multiple first global trimming latches—e.g., the number of first global trimming latches may correspond to the number of bits used to convey a first global trim parameter. In some cases, the multiple first global trimming latches are coupled with and receive first global trimming information from a single fuse set. In some cases, the multiple first global trimming latches are coupled with and receive first global trimming information from multiple fuse sets that each store a single bit of the first global trimming information. And in other cases, the multiple first global trimming latches are coupled with and receive first global trimming information from multiple fuse sets that each store multiple bits of the first global trimming information.

Second global trimming latch 365-*a* may be similarly configured as first global trimming latch 360-*a*. In some examples, second global trimming latch 365-*a* may store a bit of second global trimming information that is used to adjust a second set of operating parameters at memory bank 300-*a*. In some examples, second global trimming latch 365-*a* may store a bit of a second global trim parameter. In some examples, second global trimming latch 365-*a* is coupled with and receives the second global trimming information from a second fuse set that is different than a first fuse set that stores first global trimming information. In some examples, second global trimming latch 365-*a* may receive the second global trimming information from a first fuse set that stores first global trimming information. In some examples, option circuitry 305-*a* includes multiple second global trimming latches—e.g., the number of second global trimming latches may correspond to the number of bits used to convey a second global trim parameter.

Third global trimming latch 370-*a* may be similarly configured as second global trimming latch 365-*a* and first global trimming latch 360-*a*. In some examples, third global trimming latch 370-*a* may store an indication (e.g., a one-bit indicator) that local trimming information for memory bank 300-*a* (e.g., local trimming information stored in local trimming latch 375-*a*) is associated with one of a first or second set of operating parameters. In some cases, like the local trimming information, the indicator may be used for multiple memory banks including memory bank 300-*a*. In some examples, the indication may indicate that the local trimming information is to be used to adjust one of a first or second global trim parameter. In some examples, the indication may indicate that the local trimming information is to be used to adjust one of a first or second set of operating parameters. In some examples, third global trimming latch 370-*a* is coupled with and receives the indication from a third fuse set that is different than a first and second fuse set used to store first and second global trimming information. In some examples, third global trimming latch 370-*a* may receive the indication from a first fuse set that stores first global trimming information and/or second global trimming information.

Local trimming latch 375-*a* may be configured to store a bit of local trimming information that is used to adjust one of a first or second set of operating parameters at memory bank 300-*a* (or a set of memory banks that include memory bank 300-*a*). In some examples, local trimming latch 375-*a* may store local trimming information that is used to adjust a first set of operating parameters at memory bank 300-*a*. In some cases, local trimming latch 375-*a* stores a bit of a local trim parameter that is used to adjust one of a first or second set of operating parameters. In some cases, local trimming latch 375-*a* is a D flip flop. In some examples, a bit of data (e.g., a bit of a local trim parameter) may be applied to the input of local trimming latch 375-*a* and a voltage corresponding to the bit of data may be output by local trimming latch 375-*a* after receiving a clocking signal from fourth logic gate 355-*a*. In some cases, local trimming latch 375-*a* is coupled with and receives local trimming information from a fuse set that stores local trimming information for memory bank 300-*a*. In some cases, local trimming latch 375-*a* is coupled with and receives local trimming information from a fuse set that stores local trimming information and repair information for memory bank 300-*a*. In some cases, option circuitry 305-*a* includes multiple local trimming latches—e.g., the number of local trimming latches may correspond to the number of bits used to convey a local trim parameter. In some cases, the multiple local trimming latches may be coupled with and receive local trimming information from multiple repair fuse sets that each store repair information and one or more bits of local trimming information. In other cases, the inputs of fourth logic gate 355-*a* may be connected above the input of buffer 335-*a*, and the multiple local trimming latches may be coupled with and receive local trimming information from one or more option fuse sets that store local trimming information for memory bank 300-*a* (or a set of memory banks that include memory bank 300-*a*).

First combinational logic 380-*a* may be configured to receive the output of first global trimming latch 360-*a* and a first output of routing logic 390-*a* to generate a first local trim parameter for memory bank 300-*a*—e.g., based on a first global trim parameter output from first global trimming latch 360-*a* and local trimming information output from routing logic 390-*a*. In some cases, the first local trim parameter may be used for adjusting a first set of operating parameters for memory bank 300-*a*. In some cases, first combinational logic 380-*a* is an XOR gate, and the local trimming information is applied to the global trim parameter, yielding the first local trim parameter. In other cases, the local trimming information is a local trim parameter and is used in place of the global trim parameter. In other cases, first combinational logic 380-*a* combines the first global trim parameter and the local trimming information to create a larger local trim parameter that may be used to adjust operating parameters of memory bank 300-*a* with additional resolution.

Second combinational logic 385-*a* may be similarly configured as first combinational logic 380-*a*. Second combinational logic 385-*a* may receive the output of second global trimming latch 365-*a* and a second output of routing logic 390-*a* to generate a second local trim parameter for memory bank 300-*a*. In some cases, the second local trim parameter may be used for adjusting a second set of operating parameters for memory bank 300-*a*.

In some cases, first combinational logic 380-*a* and second combinational logic 385-*a* may not be included in memory bank 300-*a*. In some cases, when first combinational logic 380-*a* and second combinational logic 385-*a* are not included in memory bank 300-*a*, a global trim parameter and a corresponding output of routing logic 390-*a* may be independently applied to memory bank 300-*a*. In some examples, when a global trim parameter and local trimming information are independently applied at memory bank 300-*a*, operating parameters of memory bank 300-*a* may be adjusted relative to global adjustments of the operating parameters, allowing for finer adjustment of the operating parameters of memory bank 300-*a*—e.g., the operating parameters may be increased with higher resolution. In other cases, when a global trim parameter and local trimming information (e.g., a local trim parameter) are independently applied at memory bank 300-*a*, the local trimming information may override the global trim parameter and the operating parameters of memory bank 300-*a* may be adjusted based on the local trimming information.

Routing logic 390-*a* may be configured to route local trimming information received from local trimming latch 375-*a* to a particular combinational logic circuit based on an indication received from third global trimming latch 370-*a*. In some examples, routing logic 390-*a* may be configured to route local trimming information to first combinational logic 380-*a* and not to second combinational logic 385-*a* after receiving an indication that the local trimming information is intended for first combinational logic 380-*a*, and vice versa. In some cases, routing logic 390-*a* transmits a null signal (e.g., a signal that represents all zeros or ones) to second combinational logic 385-*a* after receiving the indication that the local trimming information is intended for first combinational logic 380-*a*. In other cases, routing logic 390-*a* refrains from transmitting any signal to second combinational logic 385-*a* after receiving the indication that the local trimming information is intended for first combinational logic 380-*a*—e.g., routing logic 390-*a* maintains the second output in a high impedance state.

In some cases, routing logic 390-*a* may be configured route local trimming information from multiple local trimming latches. In some examples, routing logic 390-*a* transmits the local trimming information over a bus having a width that supports the parallel signaling of a local trim parameter—e.g., a bus that include N control lines. In some cases, routing logic 390-*a* is a demultiplexer. In some cases, routing logic 390-*a* is implemented in a controller that processes information received from local trimming latch 375-*a* and third global trimming latch 370-*a* before outputting the information received from local trimming latch 375-*a* on one of multiple outputs at routing logic 390-*a*.

To support the use of routing logic 390-*a*, before local trimming information is generated, a determination may be made of which set of operating parameters may result in a larger performance enhancement for a memory system after a local modification. After determining that an adjustment to a particular set of operating parameters may result in a desired performance enhancement for the memory system, local trimming information for adjusting the identified set of operating parameters may be generated and stored in fuse set(s) that are coupled with local trimming latch 375-*a*. Additionally, an indication that the local trimming information is for the identified set of operating parameters may be stored in third global trimming latch 370-*a*. The indication may be provided to routing logic 390-*a*, and routing logic 390-*a* may transfer the signal received from local trimming latch 375-*a* to an output of routing logic 390-*a* that is coupled with combinational logic (e.g., first combinational logic 380-*a*) that is used to generate a local trim parameter for the identified set of operating parameters.

In some cases, routing logic 390-*a* may be omitted from option circuitry 305-*a*. In such cases, option circuitry 305-*a* may include multiple local trimming latches—e.g., first local trimming latch(es) that store local trimming information for adjusting a first set of operating parameters and second local trimming latch(es) that store local trimming information for adjusting a second set of operating parameters. Outputs of the multiple local trimming latches may be applied to respective combinational logic—e.g., an output of the first local trimming latch(es) may be coupled with first combinational logic 380-*a* and an output of the second local trimming latch(es) may be coupled with second combinational logic 385-*a*. By using separate local trimming latches for each set of operating parameters, local adjustments may be simultaneously applied to multiple sets of operating parameters. And by using routing logic 390-*a* instead of configuring local trimming latches for each set of operating parameters, a size and complexity of a memory system that includes memory bank 300-*a* may be decreased—e.g., fewer fuses may be dedicated to storing local trimming information, fewer latches may be configured to store local trimming information, and fewer signal paths may be used to carry local trimming information.

Repair circuitry 310-*a* may be configured to process and store defective memory addresses (e.g., row, column, or plate addresses) identified in memory bank 300-*a*. Repair circuitry 310-*a* may include fifth logic gate 392-*a*, nth logic gate 394-*a*, first local repair latch 396-*a*, and nth local repair latch 398-*a*.

Fifth logic gate 392-*a* to nth logic gate 394-*a* may be similarly configured to first logic gate 340-*a*. In some cases, fifth logic gate 392-*a* to nth logic gate 394-*a* may be used to apply respective clocking signals to first local repair latch 396-*a* to nth local repair latch 398-*a*.

First local repair latch 396-*a* may be configured to store a bit of a defective memory address. In some cases, first local repair latch 396-*a* is a D flip flop. In some examples, a bit of data (e.g., a defective memory address) may be applied to the input of first local repair latch 396-*a*, and a voltage corresponding to the bit of data may be output by first local repair latch 396-*a* after receiving a clocking signal from fifth logic gate 392-*a*.

Nth local repair latch 398-*a* may be configured to store another bit of the defective memory address. In some cases, nth local repair latch 398-*a* is a D flip flop. In some examples, a bit of data (e.g., a defective memory address) may be applied to the input of nth local repair latch 398-*a*, and a voltage corresponding to the bit of data may be output by nth local repair latch 398-*a* after receiving a clocking signal from nth logic gate 394-*a*. In some examples, nth local repair latch 398-*a* is the 16th local repair latch included in repair circuitry 310-*a*. In some cases, one or more local repair latches included in repair circuitry 310-*a* will go unused (e.g., when less than 16 bits is used to convey the applied fuse data). In some cases, first local repair latch 396-*a* to nth local repair latch 398-*a* together may be configured to store information indicating a defective memory address in memory bank 300-*a*.

Fuse data bus 315-*a* may be configured to carry data from fuses to latches such as first global trimming latch 360-*a*, second global trimming latch 365-*a*, third global trimming latch 370-*a*, local trimming latch 375-*a*, and first local repair latch 396-*a* to nth local repair latch 398-*a*. In some cases, fuse data bus 315-*a* includes N conductive traces, where N is equal to the number of fuses included in the fuse sets of a fuse array. In some cases, multiple fuse data buses may be used to carry data from fuses to latches. In some examples, a first fuse data bus is configured to carry information for option circuitry (e.g., trimming information) and a second fuse data bus is configured to carry information for repair circuitry (e.g., defective memory addresses).

Fuse select line 320-*a* may be configured to carry a signal for clocking the latches in memory bank 300-*a*. For example, a voltage pulse may be transmitted over fuse select line 320-*a* with a certain periodicity. In some cases, multiple fuse select lines may be used to carry clocking signals to latches. In some examples, a first fuse select line may be configured to carry a clocking signal to option latches and a second fuse select line may be configured to carry a clocking signal to repair latches.

First fuse token line 325-*a* may be configured to carry and pass a token from one section of memory bank 300-*a* to another section. In some cases, first fuse token line 325-*a* may be coupled with each memory bank in a memory system. Second fuse token line 330-*a* may also be configured to carry and pass a token from one section of memory bank 300-*a* to another section. In some cases, the token may be passed from first fuse token line 325-*a* to second fuse token line 330-*a*. The token, in combination with the clocking signal on fuse select line 320-*a*, may be used to ensure that latches in a single section of memory bank 300-*a* are written at a time. In some cases, fuse data bus 315-*a*, fuse select line 320-*a*, first fuse token line 325-*a* and second fuse token line 330-*a* may be included in a broadcast bus, such as broadcast bus 230 of FIG. 2. In some cases, multiple fuse token lines may be used to carry and pass a token from one section to another. In some examples, a first fuse token line may be configured to carry a token that is passed between sections of the memory array that include different option latches and a second fuse token line may be configured to carry a token that is passed between section of the memory array that include different repair latches.

When different fuse data buses, fuse select lines, and fuse token lines are used for option latches and repair latches, the information for the option latches and the information for the repair latches may be separately broadcast across a memory array.

In some examples, a fuse logic component, such as fuse logic component 225 of FIG. 2, may map certain fuse sets to certain latches in memory bank 300-*a*. Fuse logic component 225 may also control the transmission of control and data signals over fuse data bus 315-*a*, fuse select line 320-*a*, first fuse token line 325-*a*, and second fuse token line 330-*a* to ensure the correct fuse data is written to the correct latch, in what may be referred to as broadcasting. For example, fuse logic component may transmit local trimming information to be stored in local trimming latch 375-*a* and repair information to be stored in first local repair latch 396-*a* to nth local repair latch 398-*a* when second fuse token line 330-*a* is high. Broadcasting fuse data stored in a fuse array is discussed in more detail herein and with respect to FIG. 3B.

In some cases, memory bank 300-*a* may be configured with an additional buffer that may be configured to pass the token from second fuse token line 330-*a* to a next fuse token line and a next set of latches. In some examples, memory bank 300-*a* may include an additional buffer that is located between fourth logic gate 355-*a* and fifth logic gate 392-*a*—e.g., when the local trimming information is stored in a different fuse set than repair information. Additionally, or alternatively, memory bank 300-*a* may include an additional buffer that is located between first logic gate 340-*a* and second logic gate 345-*a* and another buffer that is located between second logic gate 345-*a* and third logic gate 350-*a*—e.g., when first global trimming information is stored in a first fuse set; second global trimming information is stored in a second fuse set; and an indication of which global trimming information is to be adjusted is stored in a third fuse set. Generally, a buffer may be included between latch circuitry that stores information from different fuse sets. In some cases, buffer 335-*a* may be located between fourth logic gate 355-*a* and fifth logic gate 392-*a*—e.g., when the local trimming information is stored in a same fuse set as one or more of the first global trimming information, the second global trimming information, and/or the indication.

In some cases, option circuitry 305-*a* and repair circuitry 310-*a* are coupled with additional circuitry in memory bank 300-*a*. For example, memory bank 300-*a* may include trimming components configured to modify operating parameters of memory bank 300-*a*. In some cases, the trimming components may be coupled with an output of first combinational logic 380-*a* and an output of second combinational logic 385-*a*, respectively. In some cases, the trimming components may be separately coupled with an output of a global trimming latch (e.g., first global trimming latch 360-*a*) and an output of routing logic 390-*a*. In some cases, trimming components may include a timing or delay component configured to introduce delay a signal transmitted within memory bank 300-*a*. The trimming components may also include a biasing component configured to modify a voltage or current of signals applied within memory bank 300-*a*. In some instances, the biasing component may be used to adjust an output of an operational amplifier, or driver, used to apply a voltage or current to a plate, word, or digit line of memory bank 300-*a*—e.g., the biasing component may reduce or increase the maximum output voltage of a driver.

In another example, memory bank 300-*a* may include a memory address compare component configured to compare a value of a requested memory address with a value of a defective memory address in memory bank 300-*a*. In some cases, the memory address compare component may be coupled with the outputs of first local repair latch 396-*a* to nth local repair latch 398-*a*.

Figure 3B:
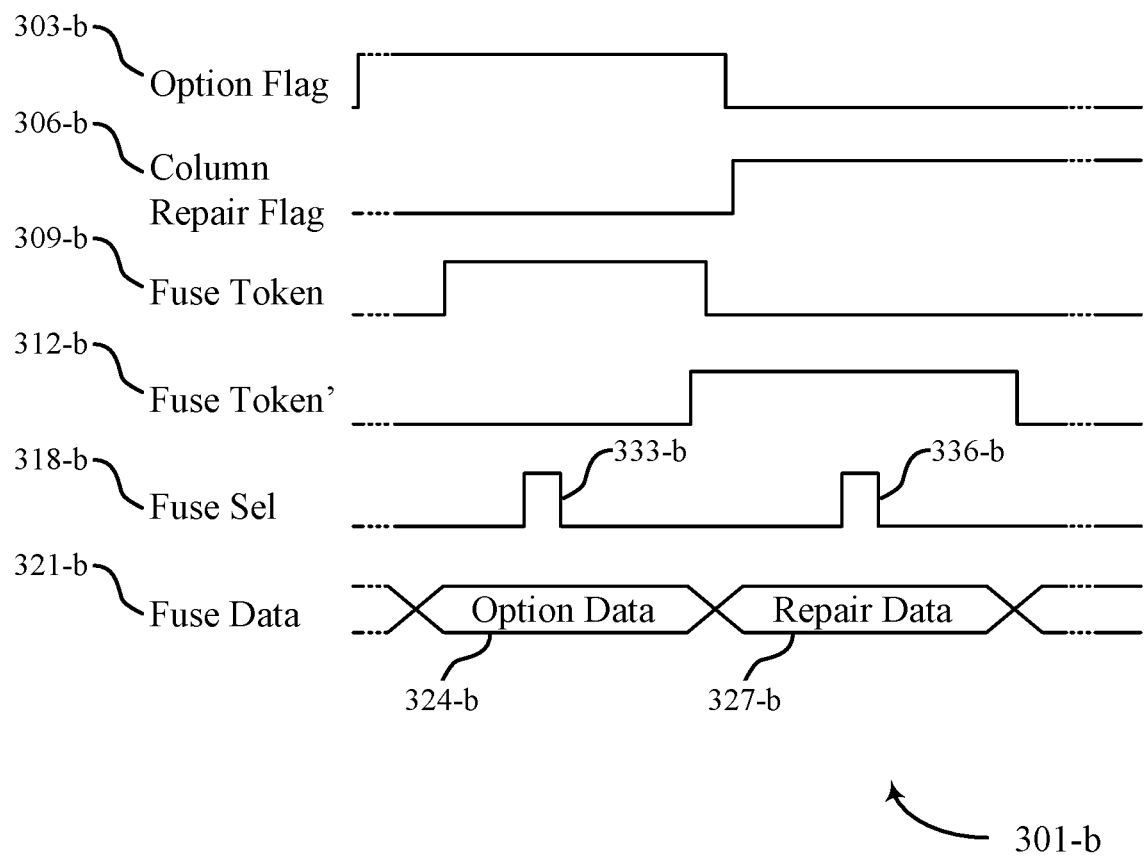
FIG. 3B illustrates an exemplary timing diagram for modifying subsets of memory bank operating parameters in accordance with various examples as disclosed herein.

FIG. 3B illustrates an exemplary timing diagram for modifying subsets of memory bank operating parameters in accordance with examples as disclosed herein. Timing diagram 301-*b* may depict exemplary signals used to operate aspects of memory bank 300-*a* of FIG. 3A. In some cases, a fuse logic component, such as fuse logic component 225, may be configured to transmit the signaling depicted in FIG. 3B.

Option flag 303-*b* may be configured to indicate when data stored in option fuses is being broadcasted throughout a memory system. Column repair flag 306-*b* may be configured to indicate when data stored in column repair fuses is being broadcasted throughout a memory system. First fuse token 309-*b* may be representative of a voltage of first fuse token line 325-*a*. Second fuse token 312-*b* may be representative of a voltage of second fuse token line 330-*a*. Fuse selection signal 318-*b* may be representative of a voltage of fuse select line 320-*a*. Fuse data 321-*b* may be representative of an N-bit word sent over fuse data bus 315-*a*.

A memory system may store information for adjusting one or more operating parameters of memory bank 300-*a* (e.g., local trimming information) in a fuse set that is coupled with memory bank 300-*a*. For instance, the memory system may store the information in the fuse set after determining that one or more operating parameters of memory bank 300-*a* is below a threshold. Additionally, or alternatively, the memory system may store the information in the fuse set based on historical information—e.g., based on known or predictable manufacturing process defects. The memory system may also store information for adjusting one or more operating parameters for multiple memory banks (e.g., global trimming information), including memory bank 300-*a*, in another fuse set that is coupled with memory bank 300-*a*. Additionally, the memory system may store information indicating a defective memory address of memory bank 300-*a* in a fuse set. In some cases, the information indicating the defective memory address (e.g., repair information) and the information for adjusting the one or more operating parameters of memory bank 300-*a* (e.g., local trimming information) may be stored in a same fuse set.

The information stored in the fuse sets may be broadcast throughout memory system. In some cases, the information is broadcast from fuses in a particular order—e.g., data stored in fuse sets storing trimming information may be transmitted first, then data stored in fuse sets storing column repair information may be transmitted, then data stored in fuse sets storing row repair information may be transmitted, and then data stored in fuse sets storing plate repair information may be transmitted (other orders may be used). In some cases, different types of information stored in the fuses are broadcast separately—e.g., data stored in fuse sets storing trimming information may be transmitted simultaneously with data stored in fuse sets storing repair information. In some cases, multiple sets of circuitry are used to support the simultaneous broadcasting of trimming and repair information.

In some examples of broadcasting fuse data, global trimming information stored in option fuses is transmitted throughout a memory system. During transmission of global trimming information, option flag 303-*b* and first fuse token 309-*b* may be high. In some cases, first fuse token 309-*b* may be simultaneously delivered to each memory bank in a memory system via first fuse token line 325-*a*. Additionally, option data 324-*b* (e.g., a first global trim parameter, a second global trim parameter, an indication of which global trim parameter local trimming information is associated with, etc.) may be present on fuse data bus 315-*a*. In some cases, option data 324-*b* may include local trimming information (e.g., local trimming parameters or information for local adjustments to global trimming parameters)—e.g., if local trimming information is stored in option fuses.

Bits of option data 324-*b* may be mapped to particular latches in memory bank 300-*a*. For example, a first bit of option data 324-*b* may be delivered to an input of first global trimming latch 360-*a*, a second bit of option data 324-*b* may be delivered to an input of second global trimming latch 365-*a*, and a third bit of option data 324-*b* may be delivered to an input of third global trimming latch 370-*a*. In some cases, the bits of option data 324-*b* that are stored in first global trimming latch 360-*a*, second global trimming latch 365-*a*, and third global trimming latch 370-*a* may be available to most or all of the memory banks in the memory system. In other cases, the bits of option data 324-*b* stored in first global trimming latch 360-*a*, second global trimming latch 365-*a*, and third global trimming latch 370-*a* may be available to a subset of memory banks, and the bits of option data 324-*b* may be similarly delivered to additional sets of global trimming latches that are coupled with additional subsets of the memory banks. In some cases, a fourth bit of option data 324-*b* may be delivered to local trimming latch 375-*a*—e.g., if local trimming information is stored in option fuses.

While first fuse token 309-*b* remains high, a first pulse 333-*b* may be transmitted over fuse select line 320-*a*. When both fuse selection signal 318-*b* and first fuse token 309-*b* are high, an output of first logic gate 340-*a* may transition from a low voltage to a high voltage. The transition of the output of first logic gate 340-*a* may clock first global trimming latch 360-*a* causing first global trimming latch 360-*a* to store a first bit of option data 324-*b* located at the input of first global trimming latch 360-*a*, second global trimming latch 365-*a* to store a second bit of option data 324-*b*, and third global trimming latch 370-*a* to store a third bit of option data 324-*b*. In some cases, local trimming latch 375-*a* may also store a fourth bit of option data 324-*b* located at the input of local trimming latch 375-*a*—e.g., if local trimming latch is connected to first fuse token line 325-*a*.

Next, column repair information may be transmitted throughout the memory system. In some cases, during transmission of the column repair information, column repair flag 306-*b* may be high. To write information to the next section of memory bank 300-*a*, the fuse token may be passed from one section of memory bank 300-*a* to the next. Accordingly, first fuse token 309-*b* may return to a low voltage and second fuse token 312-*b* may be high. In some cases, second fuse token 312-*b* may transition to a high voltage based on first fuse token 309-*b* being applied to buffer 335-*a* and a clocking signal being delivered to buffer 335-*a*. Additionally, column repair data 327-*b* may be transmitted over fuse data bus 315-*a*. As discussed herein, column repair data 327-*b* may also include local trimming information. In some cases, column repair information may be transmitted concurrently with option information, and column repair flag 306-*b* may transition to a high voltage concurrently with the option flag 303-*b*—e.g., if a separate bus and/or fuse token is configured for broadcasting repair information.

Bits of column repair data 327-*b* may be mapped to particular latches in memory bank 300-*a*. For example, a first bit of column repair data 327-*b* corresponding to a bit of local trimming information may be delivered to an input of local trimming latch 375-*a*. And bits of column repair data 327 corresponding to one or more defective column addresses may be delivered to inputs of first local repair latch 396-*a* to nth local repair latch 398-*a*.

While second fuse token 312-*b* remains high, a second pulse 336-*b* may be transmitted over fuse select line 320-*a*. When both fuse selection signal 318-*b* and second fuse token 312-*b* are high, an output of fourth logic gate 355-*a* and outputs of fifth logic gate 392-*a* to nth logic gate 394-*a* may transition from a low voltage to a high voltage. The transition of the output of fourth logic gate 355-*a* may clock local trimming latch 375-*a* causing local trimming latch 375-*a* to store a first bit of local trimming information located at the input of local trimming latch 375-*a*. The transition of the outputs of fifth logic gate 392-*a* to nth logic gate 394-*a* may clock first local repair latch 396-*a* to nth local repair latch 398-*a* causing all of first local repair latch 396-*a* to nth local repair latch 398-*a* to store respective bits of a defective column address. After column repair data 327-*b* is written to local trimming latch 375-*a* and first local repair latch 396-*a* to nth local repair latch 398-*a*, the token may be passed to a next section of memory bank 300-*a* by way of an additional buffer, and additional repair information may be written to additional latches in the next section of memory bank 300-*a*, and so on.

After the global trimming information, local trimming information, and repair information has been stored in first global trimming latch 360-*a*, local trimming latch 375-*a*, and first local repair latch 396-*a* to nth local repair latch 398-*a*, the information may be used to adjust a set of operating parameters of a subset of memory banks, including memory bank 300-*a*.

In some examples, first global trimming information stored in first global trimming latch 360-*a* may be provided to first combinational logic 380-*a*, and second global trimming information stored in second global trimming latch 365-*a* may be provided to second combinational logic 385-*a*. In some cases, first combinational logic 380-*a* may generate a first local trim parameter based on the first global trimming information, and second combinational logic 385-*a* may generate a second local trim parameter based on the second global trimming information. First combinational logic 380-*a* be coupled with and signal the first local trim parameter to first trimming circuitry, and second combinational logic 385-*a* may be coupled with and signal the second local trim parameter to second trimming circuitry. In some cases, the first trimming circuitry may adjust a first set of operating parameters for memory bank 300-*a* based on the first local trim parameter and the second trimming circuitry may adjust a second set of operating parameters for memory bank 300-*a* based on the second local trim parameter.

In some examples, routing logic 390-*a* may signal local trimming information to first combinational logic 380-*a*. In some cases, first combinational logic 380-*a* may generate a modified local trim parameter for memory bank 300-*a* based on processing the first global trimming information and the local trimming information. In some cases, first combinational logic 380-*a* may generate a modified local trim parameter by XOR'ing the first global trimming information and the local trimming information. First combinational logic 380-*a* may then signal the modified local trim parameter to the first trimming circuitry. In some examples, a timing component in the first trimming circuitry may modify a timing of a memory operations performed on memory bank 300-*a*. Additionally, or alternatively, a biasing component in the first trimming circuitry may modify a magnitude of one or more voltages or currents applied within memory bank 300-*a*—e.g., may increase or decrease the magnitude of the voltages or currents. In some examples, after receiving local trimming information from routing logic 390-*a*, first combinational logic 380-*a* may ignore the global trimming information and pass the local trimming information through to trimming circuitry in memory bank 300-*a* unchanged. In this way, each memory bank may be individually adjusted without performing global trimming.

In some cases, after signaling the local trimming information to first combinational logic 380-*a*, routing logic 390-*a* may signal a null signal to second combinational logic 385-*a*. In other cases, routing logic 390-*a* may refrain from signaling any information to second combinational logic 385-*a*. In either cases, second combinational logic 385-*a* may continue to output the second local trim parameter that is based on the second global trimming information.

In some examples, first global trimming information (e.g., a first global trim parameter) stored in first global trimming latch 360-*a* may be provided directly to first trimming circuitry in memory bank 300-*a*, and second global trimming information (e.g., a second global trim parameter) stored in second global trimming latch 365-*a* may be provided directly to second trimming circuitry in memory bank 300-*a*. In some cases, the first trimming circuitry may adjust a first set of operating parameters for memory bank 300-*a* based on the received first global trimming information, and the second trimming circuitry may adjust a second set of operating parameters for memory bank 300-*a* based on the received second global trimming information.

In some cases, after providing the global trimming information to the trimming circuitry, local trimming information (e.g., a local trim parameter) stored in local trimming latch 375-*a* may be provided to routing logic 390-*a*. Routing logic 390-*a* may also receive a signal from third global trimming latch 370-*a*. In some cases, the signal received from third global trimming latch 370-*a* causes routing logic 390-*a* to provide the local trimming information directly to the first trimming circuitry via a first output that is coupled with the first trimming circuitry. The first trimming circuitry may adjust the first set of parameters based on the received local trimming information. In some cases, the first trimming circuitry may use the local trimming information to adjust the first set of parameters relative to the adjustment made based on the first global trimming information. In this way, the local trimming information may allow for finer adjustment of local operating parameters. In some cases, a value for the local trimming information is determined after adjusting the operating parameters for memory bank 300-*a* using global trimming information. Routing logic 390-*a* may also signal a null signal (e.g., signal carrying all "0"s or "1"s) over a second output that is coupled with the second trimming circuitry based on receiving the signal from third global trimming latch 370-*a*. And the second trimming circuitry may maintain the second set of parameters based on the received second global trimming information. In some cases, instead of signaling a null signal, routing logic 390-*a* may refrain from transmitting any signal to the second trimming circuitry—e.g., routing logic 390-*a* may maintain the second output in a high impedance state.

In some examples, the repair information (e.g., one or more column addresses) stored in first local repair latch 396-*a* to nth local repair latch 398-*a* may be provided to a memory address compare component. A fuse logic component, such as fuse logic component 225, may be configured to ensure that the correct fuse data is transmitted to the correct latches. That is, the fuse logic component may cause the fuse token to be passed from one section of a memory bank to another section and may broadcast fuse data for a section when the fuse token is active in that section.

Figure 4:
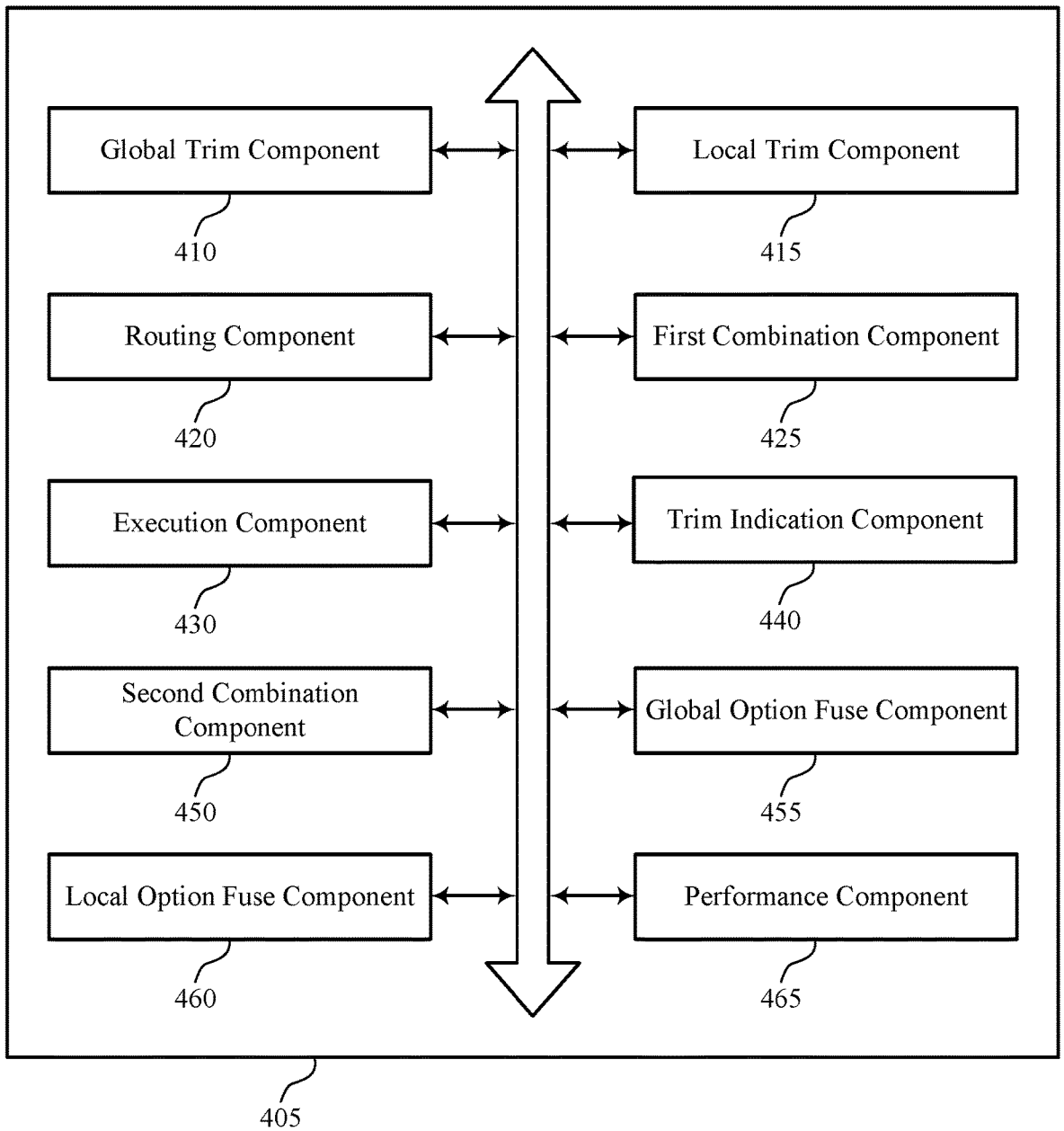
FIG. 4 shows a block diagram of a memory array that supports modifying subsets of memory bank operating parameters in accordance with examples as disclosed herein.

FIG. 4 shows a block diagram 400 of a memory array 405 that supports modifying subsets of memory bank operating parameters in accordance with examples as disclosed herein. The memory array 405 may be an example of aspects of a memory array as described with reference to FIGS. 1 through 3. The memory array 405 may include a global trim component 410, a local trim component 415, a routing component 420, a first combination component 425, an execution component 430, a trim indication component 440, a second combination component 450, a global option fuse component 455, a local option fuse component 460, and a performance component 465. Each of these modules may communicate, directly or indirectly, with one another (e.g., via one or more buses).

The global trim component 410 may identify, for a set of memory banks having a first operating parameter and a second operating parameter, a first value for the first operating parameter and a second value for the second operating parameter. In some cases, the first value for the first operating parameter is configured to adjust or set the magnitude of the first operating parameter, and the second value for the second operating parameter is configured to adjust or set the magnitude of the second operating parameter.

In some examples, the global trim component 410 may receive, for the memory bank, the first value, the second value, and the indication from a first fuse set. In some examples, the global trim component 410 may receive, for the memory bank, the first value from a first fuse set, the second value from a second fuse set, and the indication from a third fuse set. In some examples, the global trim component 410 may store, in a set of latches associated with the memory bank or outside of the memory bank, the first value, the second value, and an indication that information for adjusting one of the first value or the second value is associated with the first operating parameter.

In some examples, the global trim component 410 may signal the first value to a first logic component associated with the memory bank and the second value to a second logic component associated with the memory bank, where the first logic component is associated with the first operating parameter and the second logic component is associated with the second operating parameter.

The local trim component 415 may identify, for a memory bank of the set of memory banks, information for adjusting one of the first value or the second value. In some examples, the local trim component 415 may receive, for the memory bank, the information for adjusting one of the first value or the second value from a second fuse set. In some examples, the local trim component 415 may receive, for the memory bank, an address of a defective memory location from the second fuse set. In some cases, the local trim component 415 may store, in a latch associated with the memory bank, the information for adjusting.

The routing component 420 may receive, for the memory bank, an indication that the information for adjusting is associated with the first operating parameter. In some examples, the routing component 420 may signal the information for adjusting to the first logic component based on receiving the indication that the information is associated with the first operating parameter. In some examples, the routing component 420 may signal information for preserving the second value to the second logic component based on receiving the indication that the information is associated with the first operating parameter.

The first combination component 425 may combine, for the memory bank, the information for adjusting with the first value based on receiving the indication, where the first value for the first operating parameter is adjusted to a third value at the memory bank based on the combining. In some cases, the third value for the first operating parameter is configured to adjust or set the magnitude of the first operating parameter measured for the memory bank. In some examples, the first combination component 425 may apply an exclusive OR operation to the first value and the information for adjusting, where the third value is equivalent to a resulting value of the exclusive OR operation. In some examples, the first combination component 425 may append the information for adjusting to the first value, where the third value is equivalent to a resulting value of the appending, and where the third value results in a finer adjustment to the first operating parameter than the first value.

The second combination component 450 may apply, by the second logic component, an exclusive OR operation to the second value and the information for preserving, where the second value is equivalent to a resulting value of the exclusive OR operation.

The execution component 430 may perform, on the memory bank, a memory operation based on the applying, where, during the memory operation, a magnitude of the first operating parameter at the memory bank is based on the third value. In some examples, the execution component 430 may, during the memory operation, a second magnitude of the second operating parameter associated with the memory bank is based on the second value. In some examples, the execution component 430 may perform, on a second memory bank of the set of memory banks, a second memory operation after the applying, where, during the memory operation, a second magnitude of the first operating parameter associated with the second memory bank is based on the first value without using the information for adjusting.

The global option fuse component 455 may store the first value, the second value, and the indication in a first fuse set. In some examples, the global option fuse component 455 may store the first value in a first fuse set, the second value in a second fuse set, and the indication in a third fuse set.

The local option fuse component 460 may store the information for adjusting one of the first value or the second value in a second fuse set. In some examples, the local option fuse component 460 may store information for adjusting the first value in the second fuse set based on the determining. In some examples, the second fuse set may also store repair information.

The performance component 465 may determine that a performance level of the memory bank is increased when the first operating parameter is modified relative to when the second operating parameter is modified.

In some examples, the global storage component 470 may store, for a set of memory banks, a first global trim parameter and a second global trim parameter. In some examples, the global storage component 470 may signal the first global trim parameter to a first logic component. In some examples, the global storage component 470 may signal the second global trim parameter to a third logic component.

The local storage component 475 may store, for a memory bank of the set of memory banks, information for adjusting one of the first global trim parameter or the second global trim parameter, where a first local trim parameter and a second local trim parameter for the memory bank are generated based on the information for adjusting one of the first global trim parameter or the second global trim parameter. In some cases, the first global trim parameter and the first local trim parameter are associated with a first operating parameter of the set of memory banks. In some cases, the second global trim parameter and the second local trim parameter are associated with a second operating parameter of the set of memory banks.

The indication storage component 490 may store an indication that the information for adjusting is associated with the first global trim parameter. In some examples, the indication storage component 490 may signal the indication to the routing component 480.

The routing component 480 may determine, at the memory bank, that the information is for adjusting a value of the first global trim parameter. In some examples, routing component 480 may determine the information for adjusting is for adjusting the first global trim parameter based on receiving the indication. In some examples, the routing component 480 may signal the information for adjusting to the first logic component based on the determining. In some examples, the routing component 480 may signal information for preserving the second global trim parameter to the third logic component based on the determining.

The combination component 485 may combine the information for adjusting with the first global trim parameter based on the determining, where the first local trim parameter is generated based on the combining.

The execution component 495 may perform, by the memory bank, a memory operation based on the adjusting, where, during the memory operation, a first magnitude of a first operating parameter associated with the memory bank corresponds to the first local trim parameter and a second magnitude of a second operating parameter associated with the memory bank corresponds to the second global trim parameter.

Figure 5:
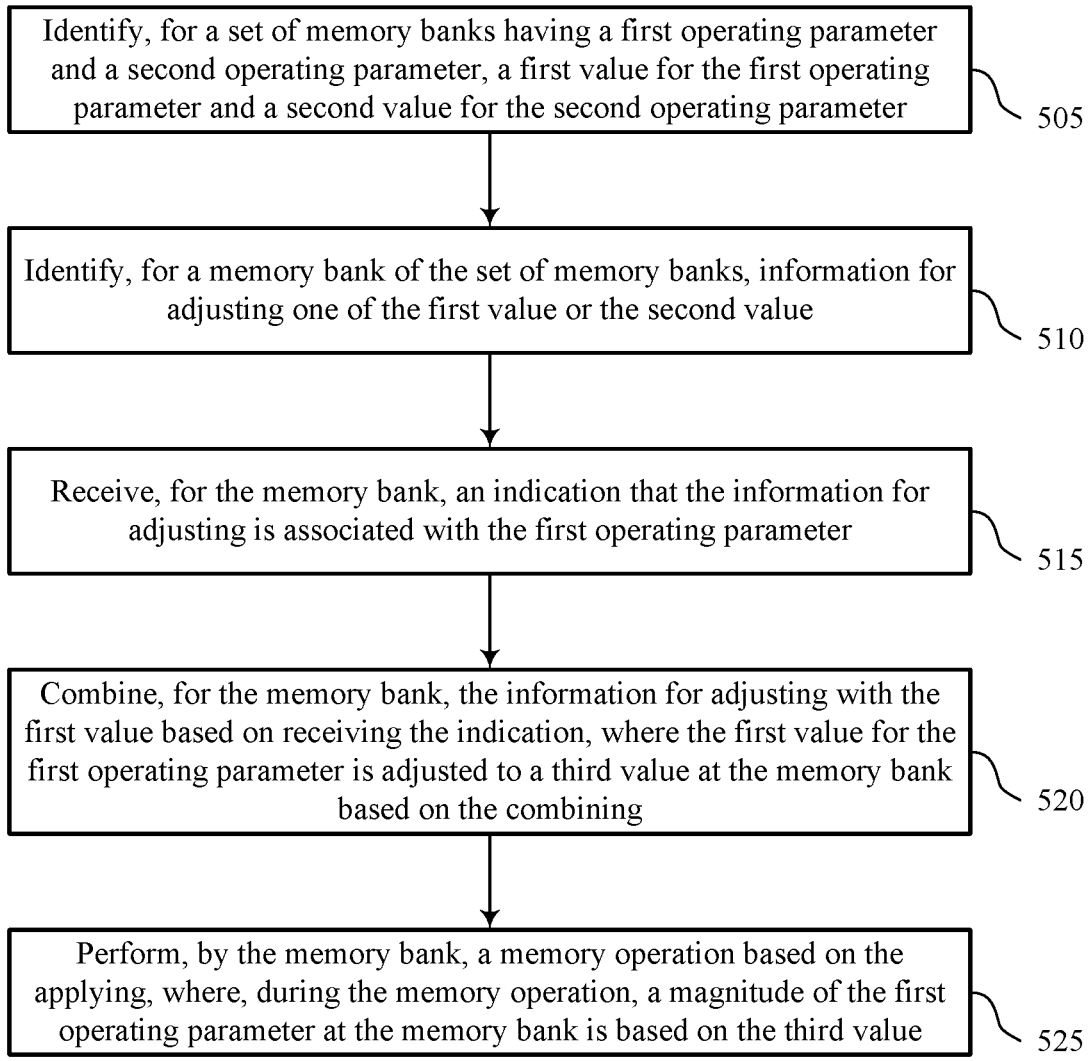
FIGS. 5 and 6 show flowcharts illustrating a method or methods that support modifying subsets of memory bank operating parameters in accordance with examples as disclosed herein.

FIG. 5 shows a flowchart illustrating a method or methods 500 that supports modifying subsets of memory bank operating parameters in accordance with examples as disclosed herein. The operations of method 500 may be implemented by a memory array or its components as described herein. For example, the operations of method 500 may be performed by a memory array as described with reference to FIG. 4. In some examples, a memory array may execute a set of instructions to control the functional elements of the memory array to perform the described functions. Additionally, or alternatively, a memory array may perform aspects of the described functions using special-purpose hardware.

At 505, the memory array may identify, for a set of memory banks having a first operating parameter and a second operating parameter, a first value for the first operating parameter and a second value for the second operating parameter. The operations of 505 may be performed according to the methods described herein. In some examples, aspects of the operations of 505 may be performed by a first global trim component as described with reference to FIG. 4.

At 510, the memory array may identify, for a memory bank of the set of memory banks, information for adjusting one of the first value or the second value. The operations of 510 may be performed according to the methods described herein. In some examples, aspects of the operations of 510 may be performed by a second global trim component as described with reference to FIG. 4.

At 515, the memory array may receive, for the memory bank, an indication that the information for adjusting is associated with the first operating parameter. The operations of 515 may be performed according to the methods described herein. In some examples, aspects of the operations of 515 may be performed by a routing component as described with reference to FIG. 4.

At 520, the memory array may combine, for the memory bank, the information for adjusting with the first value based on receiving the indication, where the first value for the first operating parameter is adjusted to a third value at the memory bank based on the combining. The operations of 520 may be performed according to the methods described herein. In some examples, aspects of the operations of 520 may be performed by a first combination component as described with reference to FIG. 4.

At 525, the memory array may perform, by the memory bank, a memory operation based on the applying, where, during the memory operation, a magnitude of the first operating parameter at the memory bank is based on the third value. The operations of 525 may be performed according to the methods described herein. In some examples, aspects of the operations of 525 may be performed by an execution component as described with reference to FIG. 4.

In some examples, an apparatus as described herein may perform a method or methods, such as the method 500. The apparatus may include features, means, or instructions (e.g., a non-transitory computer-readable medium storing instructions executable by a processor) for identifying, for a set of memory banks having a first operating parameter and a second operating parameter, a first value for the first operating parameter and a second value for the second operating parameter, identifying, for a memory bank of the set of memory banks, information for adjusting one of the first value or the second value, receiving, for the memory bank, an indication that the information for adjusting is associated with the first operating parameter, combining, for the memory bank, the information for adjusting with the first value based on receiving the indication, where the first value for the first operating parameter is adjusted to a third value at the memory bank based on the combining, and performing, by the memory bank, a memory operation based on the applying, where, during the memory operation, a magnitude of the first operating parameter at the memory bank is based on the third value.

Some examples of the method 500 and the apparatus described herein may further include operations, features, means, or instructions for storing, in a latch associated with the memory bank, the information for adjusting.

Some examples of the method 500 and the apparatus described herein may further include operations, features, means, or instructions for storing, in a set of latches associated with the memory bank or outside of the memory bank, the first value, the second value, and the indication.

In some examples of the method 500 and the apparatus described herein, the combining further may include operations, features, means, or instructions for applying an exclusive OR operation to the first value and the information for adjusting, where the third value may be equivalent to a resulting value of the exclusive OR operation.

In some examples of the method 500 and the apparatus described herein, the combining further may include operations, features, means, or instructions for appending the information for adjusting to the first value, where the third value may be equivalent to a resulting value of the appending, and where the third value results in a finer adjustment to the first operating parameter than the first value.

Some examples of the method 500 and the apparatus described herein may further include operations, features, means, or instructions for signaling the first value to a first logic component associated with the memory bank and the second value to a second logic component associated with the memory bank, where the first logic component may be associated with the first operating parameter and the second logic component may be associated with the second operating parameter, and signaling the information for adjusting to the first logic component based on receiving the indication that the information may be associated with the first operating parameter.

Some examples of the method 500 and the apparatus described herein may further include operations, features, means, or instructions for signaling information for preserving the second value to the second logic component based on receiving the indication that the information may be associated with the first operating parameter.

In some examples of the method 500 and the apparatus described herein, the combining further may include operations, features, means, or instructions for applying, by the second logic component, an exclusive OR operation to the second value and the information for preserving, where the second value may be equivalent to a resulting value of the exclusive OR operation.

Some examples of the method 500 and the apparatus described herein may further include operations, features, means, or instructions for during the memory operation, a second magnitude of the second operating parameter associated with the memory bank may be based on the second value.

Some examples of the method 500 and the apparatus described herein may further include operations, features, means, or instructions for performing, by a second memory bank of the set of memory banks, a second memory operation after the applying, where, during the memory operation, a second magnitude of the first operating parameter associated with the second memory bank may be based on the first value without using the information for adjusting.

In some examples of the method 500 and the apparatus described herein, the first value for the first operating parameter may be configured to adjust or set the magnitude of the first operating parameter, the second value for the second operating parameter may be configured to adjust or set the magnitude of the second operating parameter, and the third value for the first operating parameter may be configured to adjust or set the magnitude of the first operating parameter measured for the memory bank.

Some examples of the method 500 and the apparatus described herein may further include operations, features, means, or instructions for storing the first value, the second value, and the indication in a first fuse set, storing the information for adjusting one of the first value or the second value in a second fuse set, determining that a performance level of the memory bank may be increased when the first operating parameter may be modified relative to when the second operating parameter may be modified, and storing information for adjusting the first value in the second fuse set based on the determining.

Some examples of the method 500 and the apparatus described herein may further include operations, features, means, or instructions for receiving, for the memory bank, the first value, the second value, and the indication from a first fuse set, and receiving, for the memory bank, the information for adjusting one of the first value or the second value from a second fuse set.

Some examples of the method 500 and the apparatus described herein may further include operations, features, means, or instructions for receiving, for the memory bank, an address of a defective memory location from the second fuse set.

Some examples of the method 500 and the apparatus described herein may further include operations, features, means, or instructions for receiving, for the memory bank, the first value from a first fuse set, the second value from a second fuse set, and the indication from a third fuse set.

Figure 6:
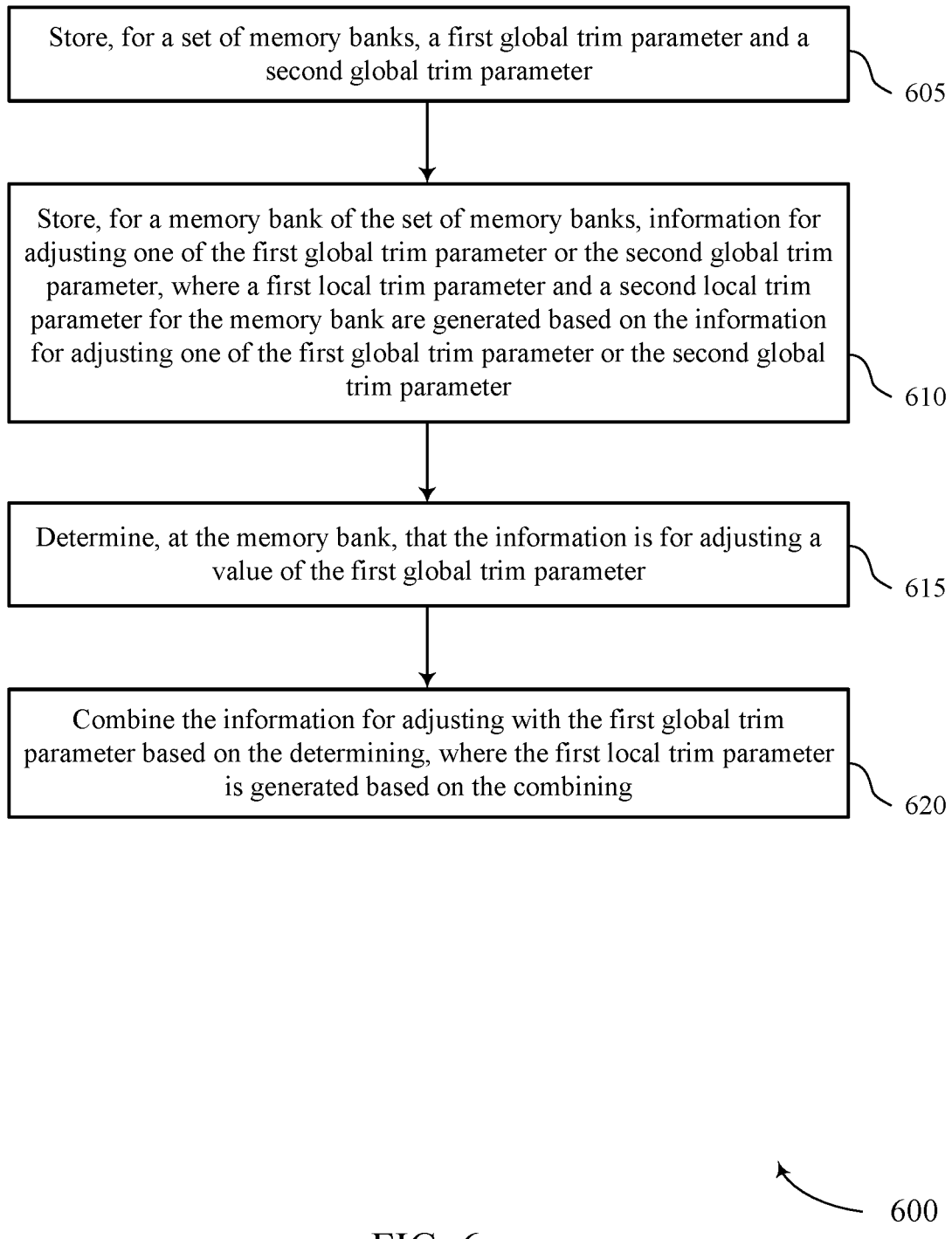

FIG. 6 shows a flowchart illustrating a method or methods 600 that supports modifying subsets of memory bank operating parameters in accordance with examples as disclosed herein. The operations of method 600 may be implemented by a memory array or its components as described herein. For example, the operations of method 600 may be performed by a memory array as described with reference to FIG. 4. In some examples, a memory array may execute a set of instructions to control the functional elements of the memory array to perform the described functions. Additionally, or alternatively, a memory array may perform aspects of the described functions using special-purpose hardware.

At 605, the memory array may store, for a set of memory banks, a first global trim parameter and a second global trim parameter. The operations of 605 may be performed according to the methods described herein. In some examples, aspects of the operations of 605 may be performed by a global storage component as described with reference to FIG. 4.

At 610, the memory array may store, for a memory bank of the set of memory banks, information for adjusting one of the first global trim parameter or the second global trim parameter, where a first local trim parameter and a second local trim parameter for the memory bank are generated based on the information for adjusting one of the first global trim parameter or the second global trim parameter. The operations of 610 may be performed according to the methods described herein. In some examples, aspects of the operations of 610 may be performed by a local storage component as described with reference to FIG. 4.

At 615, the memory array may determine, at the memory bank, that the information is for adjusting a value of the first global trim parameter. The operations of 615 may be performed according to the methods described herein. In some examples, aspects of the operations of 615 may be performed by a routing component as described with reference to FIG. 4.

At 620, the memory array may combine the information for adjusting with the first global trim parameter based on the determining, where the first local trim parameter is generated based on the combining. The operations of 620 may be performed according to the methods described herein. In some examples, aspects of the operations of 620 may be performed by a combination component as described with reference to FIG. 4.

In some examples, an apparatus as described herein may perform a method or methods, such as the method 600. The apparatus may include features, means, or instructions (e.g., a non-transitory computer-readable medium storing instructions executable by a processor) for storing, for a set of memory banks, a first global trim parameter and a second global trim parameter, storing, for a memory bank of the set of memory banks, information for adjusting one of the first global trim parameter or the second global trim parameter, where a first local trim parameter and a second local trim parameter for the memory bank are generated based on the information for adjusting one of the first global trim parameter or the second global trim parameter, determining, at the memory bank, that the information is for adjusting a value of the first global trim parameter, and combining the information for adjusting with the first global trim parameter based on the determining, where the first local trim parameter is generated based on the combining.

Some examples of the method 600 and the apparatus described herein may further include operations, features, means, or instructions for storing an indication that the information for adjusting may be associated with the first global trim parameter, and signaling the indication to a multiplexing component that determines the information for adjusting may be for adjusting the first global trim parameter based on receiving the indication.

Some examples of the method 600 and the apparatus described herein may further include operations, features, means, or instructions for signaling the first global trim parameter to a first logic component, and signaling, by a second logic component, the information for adjusting to the first logic component based on the determining.

Some examples of the method 600 and the apparatus described herein may further include operations, features, means, or instructions for signaling the second global trim parameter to a third logic component, and signaling, by the second logic component, information for preserving the second global trim parameter to the third logic component based on the determining.

In some examples of the method 600 and the apparatus described herein, the first global trim parameter and the first local trim parameter may be associated with a first operating parameter of the set of memory banks, and the second global trim parameter and the second local trim parameter may be associated with a second operating parameter of the set of memory banks.

Some examples of the method 600 and the apparatus described herein may further include operations, features, means, or instructions for performing, by the memory bank, a memory operation based on the adjusting, where, during the memory operation, a first magnitude of a first operating parameter associated with the memory bank corresponds to the first local trim parameter and a second magnitude of a second operating parameter associated with the memory bank corresponds to the second global trim parameter.

It should be noted that the methods described herein are possible implementations, and that the operations and the steps may be rearranged or otherwise modified and that other implementations are possible. Furthermore, portions from two or more of the methods may be combined.

An apparatus for operating a memory array is described. The apparatus may include a processor, memory in electronic communication with the processor, and instructions stored in the memory. The instructions may be executable by the processor to cause the apparatus to a set of memory banks having a set of operating parameters, a first set of latches common to the set of memory banks and configured to store a first set of values for the set of operating parameters, a second set of latches associated with a memory bank of the set of memory banks and configured to store a second set of values for the set of operating parameters, a first latch associated with the memory bank and configured to store information for adjusting a subset of the first set of values to generate the second set of values, a second latch configured to store an indication of the subset of the first set of values, and a multiplexing component configured to receive the indication and signal the information for adjusting to the indicated subset of the first set of values.

Some examples of the apparatus may include a first logic component configured to receive and combine a first value of the first set of values and a first output of the multiplexing component that includes the information for adjusting, and a second logic component configured to receive and combine a second value of the first set of values and a second output of the multiplexing component.

In some examples, the first logic component includes a first exclusive OR gate and the second logic component includes a second exclusive OR gate.

In some examples, the multiplexing component may be further configured to signal information for preserving the remaining subset of the first set of values, and where the second output includes the information for preserving.

Some examples of the apparatus may include a buffering component configured to decouple the first set of latches from the first latch, where the buffering component may be configured to activate the first set of latches during a first time period for broadcasting the first set of values and to activate the second set of latches during a different time period for broadcasting the second set of values.

Some examples of the apparatus may include a first fuse set configured to store the first set of values, and a second fuse set configured to the information for adjusting.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   identifying, for a plurality of memory banks having a first operating parameter and a second operating parameter, a first global trim parameter having a first value for the first operating parameter and a second global trim parameter having a second value for the second operating parameter;

identifying, for a memory bank of the plurality of memory banks, information for adjusting one of the first global trim parameter or the second global trim parameter, wherein a first local trim parameter or a second local trim parameter for the memory bank is generated based at least in part on the information for adjusting;

receiving, for the memory bank, an indication that the information for adjusting is associated with the first operating parameter;

combining, for the memory bank, the information for adjusting with the first global trim parameter based at least in part on receiving the indication, wherein the first local trim parameter having a third value is generated based at least in part on the combining; and performing, by the memory bank, a memory operation based at least in part on the combining, wherein, during the memory operation, a magnitude of the first operating parameter at the memory bank is based at least in part on the third value of the first local trim parameter.

2. The method of claim 1, further comprising:
storing, in a latch associated with the memory bank, the information for adjusting.

3. The method of claim 1, further comprising:
storing, in a plurality of latches associated with the memory bank or outside of the memory bank, the first value of the first global trim parameter, the second value of the second global trim parameter, and the indication.

4. The method of claim 1, wherein the combining further comprises:
applying an exclusive OR operation to the first value of the first global trim parameter and the information for adjusting, wherein the third value of the first local trim parameter is equivalent to a resulting value of the exclusive OR operation.

5. The method of claim 1, wherein the combining further comprises:
appending the information for adjusting to the first value of the first global trim parameter, wherein the third value of the first local trim parameter is equivalent to a resulting value of the appending, and wherein the third value results in a finer adjustment to the first operating parameter than the first value.

6. The method of claim 1, further comprising:
signaling the first value of the first global trim parameter to a first logic component associated with the memory bank and the second value of the second global trim parameter to a second logic component associated with the memory bank, wherein the first logic component is associated with the first operating parameter and the second logic component is associated with the second operating parameter; and
signaling the information for adjusting to the first logic component based at least in part on receiving the indication that the information is associated with the first operating parameter.

7. The method of claim 6, further comprising:
signaling, to the second logic component, information for preserving the second value of the second global trim parameter based at least in part on receiving the indication that the information is associated with the first operating parameter.

8. The method of claim 7, wherein the combining further comprises:
applying, by the second logic component, an exclusive OR operation to the second value of the second global trim parameter and the information for preserving, wherein the second value is equivalent to a resulting value of the exclusive OR operation.

9. The method of claim 1, further comprising:
performing, by a second memory bank of the plurality of memory banks, a second memory operation after the combining, wherein, during the memory operation, a second magnitude of the first operating parameter at the second memory bank is based at least in part on the first value of the first global trim parameter without using the information for adjusting.

10. The method of claim 1, wherein:
the first value of the first global trim parameter is configured to adjust or set the magnitude of the first operating parameter,
the second value of the second global trim parameter is configured to adjust or set the magnitude of the second operating parameter, and
the third value of the first local trim parameter is configured to adjust or set the magnitude of the first operating parameter measured for the memory bank.

11. The method of claim 1, further comprising:
storing the first value of the first global trim parameter, the second value of the second global trim parameter, and the indication in a first fuse set;
storing the information for adjusting one of the first value or the second value in a second fuse set;
determining that a performance level of the memory bank is increased when the first operating parameter is modified relative to when the second operating parameter is modified; and
storing information for adjusting the first value in the second fuse set based at least in part on the determining.

12. The method of claim 1, further comprising:
receiving, for the memory bank, the first value of the first global trim parameter, the second value of the second global trim parameter, and the indication from a first fuse set;
receiving, for the memory bank, the information for adjusting one of the first value or the second value from a second fuse set; and
receiving, for the memory bank, an address of a defective memory location from the second fuse set.

13. The method of claim 1, further comprising:
receiving, for the memory bank, the first value of the first global trim parameter from a first fuse set, the second value of the second global trim parameter from a second fuse set, and the indication from a third fuse set.

14. A method, comprising:
storing, for a plurality of memory banks, a first global trim parameter and a second global trim parameter;
storing, for a memory bank of the plurality of memory banks, information for adjusting one of the first global trim parameter or the second global trim parameter, wherein a first local trim parameter and a second local trim parameter for the memory bank are generated based at least in part on the information for adjusting one of the first global trim parameter or the second global trim parameter;
determining, at the memory bank, that the information is for adjusting a value of the first global trim parameter; and combining the information for adjusting with the first global trim parameter based at least in part on the determining, wherein the first local trim parameter is generated based at least in part on the combining.

15. The method of claim 14, further comprising:
storing an indication that the information for adjusting is associated with the first global trim parameter; and
signaling the indication to a multiplexing component that determines the information for adjusting is for adjusting the first global trim parameter based at least in part on receiving the indication.

16. The method of claim 14, further comprising:
signaling the first global trim parameter to a first logic component; and
signaling, by a second logic component, the information for adjusting to the first logic component based at least in part on the determining.

17. The method of claim 16, further comprising:
signaling the second global trim parameter to a third logic component; and
signaling, by the second logic component, information for preserving the second global trim parameter to the third logic component based at least in part on the determining.

18. The method of claim 14, wherein:
the first global trim parameter and the first local trim parameter are associated with a first operating parameter of the plurality of memory banks, and
the second global trim parameter and the second local trim parameter are associated with a second operating parameter of the plurality of memory banks.

19. The method of claim 14, wherein:
performing, by the memory bank, a memory operation based at least in part on the adjusting, wherein, during the memory operation, a first magnitude of a first operating parameter associated with the memory bank corresponds to the first local trim parameter and a second magnitude of a second operating parameter associated with the memory bank corresponds to the second global trim parameter.

20. An apparatus, comprising:
a plurality of memory banks having a plurality of operating parameters;
a first plurality of latches common to the plurality of memory banks and configured to store a first plurality of values for the plurality of operating parameters;
a second plurality of latches associated with a memory bank of the plurality of memory banks and configured to store a second plurality of values for the plurality of operating parameters;
a first latch associated with the memory bank and configured to store information for adjusting a subset of the first plurality of values to generate the second plurality of values;
a second latch configured to store an indication of the subset of the first plurality of values; and
a multiplexing component configured to receive the indication and signal the information for adjusting to the indicated subset of the first plurality of values.

21. The apparatus of claim 20, further comprising:
a first logic component configured to receive and combine a first value of the first plurality of values and a first output of the multiplexing component that comprises the information for adjusting; and
a second logic component configured to receive and combine a second value of the first plurality of values and a second output of the multiplexing component.

22. The apparatus of claim 21, wherein the first logic component comprises a first exclusive OR gate and the second logic component comprises a second exclusive OR gate.

23. The apparatus of claim 21, wherein the multiplexing component is further configured to signal information for preserving the remaining subset of the first plurality of values, and wherein the second output comprises the information for preserving.

24. The apparatus of claim 20, further comprising:
a buffering component configured to decouple the first plurality of latches from the first latch, wherein the buffering component is configured to activate the first plurality of latches during a first time period for broadcasting the first plurality of values and to activate the second plurality of latches during a different time period for broadcasting the second plurality of values.

25. The apparatus of claim 20, further comprising:
a first fuse set configured to store the first plurality of values; and
a second fuse set configured to the information for adjusting.

* * * * *